(12) United States Patent
Vrtis et al.

(10) Patent No.: US 8,399,349 B2
(45) Date of Patent: Mar. 19, 2013

(54) MATERIALS AND METHODS OF FORMING CONTROLLED VOID

(75) Inventors: Raymond Nicholas Vrtis, Orefield, PA (US); Dingjun Wu, Macungie, PA (US); Mark Leonard O'Neill, Allentown, PA (US); Mark Daniel Bitner, Nazareth, PA (US); Jean Louise Vincent, Bethlehem, PA (US); Eugene Joseph Karwacki, Jr., Orefield, PA (US); Aaron Scott Lukas, Washington, DC (US)

(73) Assignee: Air Products and Chemicals, Inc., Allentown, PA (US)

( * ) Notice: Subject to any disclaimer, the term of this patent is extended or adjusted under 35 U.S.C. 154(b) by 723 days.

(21) Appl. No.: 11/693,707

(22) Filed: Mar. 29, 2007

(65) Prior Publication Data

US 2008/0038934 A1 Feb. 14, 2008

Related U.S. Application Data

(60) Provisional application No. 60/792,793, filed on Apr. 18, 2006.

(51) Int. Cl.
*H01L 21/4763* (2006.01)

(52) U.S. Cl. ............ 438/619; 438/421; 257/E21.564; 257/E21.573; 257/E21.581; 257/E23.013

(58) Field of Classification Search .............. 438/619, 438/421; 257/E21.564, 573, 581, E23.013
See application file for complete search history.

(56) References Cited

U.S. PATENT DOCUMENTS

| | | | |
|---|---|---|---|
| 4,564,997 A * | 1/1986 | Matsuo et al. | 438/631 |
| 4,885,186 A * | 12/1989 | Bagley et al. | 427/539 |
| 4,889,609 A * | 12/1989 | Cannella | 204/298.35 |
| 5,510,645 A * | 4/1996 | Fitch et al. | 257/522 |
| 6,054,206 A | 4/2000 | Mountsier | |
| 6,054,379 A | 4/2000 | Yau et al. | |
| 6,057,226 A | 5/2000 | Wong | |
| 6,132,814 A | 10/2000 | Livesay et al. | |
| 6,159,871 A | 12/2000 | Loboda et al. | |
| 6,171,945 B1 | 1/2001 | Mandal et al. | |
| 6,200,900 B1 | 3/2001 | Kitch | |

(Continued)

FOREIGN PATENT DOCUMENTS

CN 1576390 A 2/2005
EP 0 895 276 A1 2/1999

(Continued)

OTHER PUBLICATIONS

Chattopadhyay, S. et al.; "Electron Beam Modification of Thermoplastic Elastomeric Blends made from Polyolefins"; Journal of Materials Science 36; 2001; pp. 4323-4330.

(Continued)

*Primary Examiner* — Thao Le
*Assistant Examiner* — Eric Jones
(74) *Attorney, Agent, or Firm* — Lina Yang

(57) ABSTRACT

The present invention is a process for forming an air gap within a substrate, the process comprising: providing a substrate; depositing a sacrificial material by deposition of at least one sacrificial material precursor; depositing a composite layer; removale of the porogen material in the composite layer to form a porous layer and contacting the layered substrate with a removal media to substantially remove the sacrificial material and provide the air gaps within the substrate; wherein the at least one sacrificial material precursor is selected from the group consisting of: an organic porogen; silicon, and a polar solvent soluble metal oxide and mixtures thereof.

13 Claims, 11 Drawing Sheets

U.S. PATENT DOCUMENTS

| | | | |
|---|---|---|---|
| 6,204,201 B1 | 3/2001 | Ross | |
| 6,204,202 B1 | 3/2001 | Leung et al. | |
| 6,207,555 B1 | 3/2001 | Ross | |
| 6,208,015 B1 | 3/2001 | Bandyopadhyay et al. | |
| 6,211,057 B1 | 4/2001 | Lin et al. | |
| 6,214,719 B1 | 4/2001 | Nag | |
| 6,228,763 B1 | 5/2001 | Lee | |
| 6,238,987 B1 | 5/2001 | Lee | |
| 6,245,655 B1* | 6/2001 | Moslehi | 438/612 |
| 6,265,321 B1* | 7/2001 | Chooi et al. | 438/725 |
| 6,268,277 B1 | 7/2001 | Bang | |
| 6,274,920 B1 | 8/2001 | Park et al. | |
| 6,277,705 B1 | 8/2001 | Lee | |
| 6,281,585 B1 | 8/2001 | Bothra | |
| 6,287,979 B1 | 9/2001 | Zhou et al. | |
| 6,297,125 B1 | 10/2001 | Nag et al. | |
| 6,316,347 B1 | 11/2001 | Chang et al. | |
| 6,329,279 B1 | 12/2001 | Lee | |
| 6,365,266 B1 | 4/2002 | MacDougall et al. | |
| 6,376,330 B1 | 4/2002 | Fulford, Jr. et al. | |
| 6,380,106 B1 | 4/2002 | Lim et al. | |
| 6,380,206 B1 | 4/2002 | Pamukcu et al. | |
| 6,403,461 B1 | 6/2002 | Tae et al. | |
| 6,406,992 B1 | 6/2002 | Mao et al. | |
| 6,413,852 B1* | 7/2002 | Grill et al. | 438/619 |
| 6,472,719 B1 | 10/2002 | Lin et al. | |
| 6,498,070 B2 | 12/2002 | Chang et al. | |
| 6,583,048 B1 | 6/2003 | Vincent et al. | |
| 6,592,980 B1 | 7/2003 | MacDougall et al. | |
| 6,649,531 B2* | 11/2003 | Cote et al. | 438/714 |
| 6,713,835 B1 | 3/2004 | Horak et al. | |
| 6,720,655 B1 | 4/2004 | Ahn et al. | |
| 6,743,731 B1 | 6/2004 | Huggins | |
| 6,809,032 B1* | 10/2004 | Mauersberger et al. | 438/692 |
| 6,818,289 B2 | 11/2004 | MacDougall et al. | |
| 6,835,616 B1 | 12/2004 | Ben-Tzur et al. | |
| 6,846,515 B2 | 1/2005 | Vrtis et al. | |
| 6,918,404 B2 | 7/2005 | Dias da Silva | |
| 6,942,918 B2 | 9/2005 | MacDougall et al. | |
| 7,041,224 B2 | 5/2006 | Patel et al. | |
| 7,122,880 B2 | 10/2006 | Peterson et al. | |
| 7,253,100 B2* | 8/2007 | DellaGuardia et al. | 438/637 |
| 7,608,545 B2* | 10/2009 | Yun | 438/700 |
| 7,629,225 B2* | 12/2009 | Naujok et al. | 438/421 |
| 7,645,700 B2* | 1/2010 | Standaert et al. | 438/672 |
| 2001/0007788 A1 | 7/2001 | Chang et al. | |
| 2002/0002563 A1 | 1/2002 | Bendik | |
| 2002/0016888 A1 | 2/2002 | Kobayashi | |
| 2002/0025653 A1 | 2/2002 | Sasaki | |
| 2002/0058337 A1 | 5/2002 | Pageon et al. | |
| 2002/0090794 A1 | 7/2002 | Chang et al. | |
| 2002/0106888 A1 | 8/2002 | Vassalli et al. | |
| 2002/0132459 A1* | 9/2002 | Gonzalez | 438/593 |
| 2002/0149085 A1 | 10/2002 | Lin et al. | |
| 2002/0158337 A1 | 10/2002 | Babich et al. | |
| 2002/0195423 A1 | 12/2002 | Patel et al. | |
| 2003/0073302 A1 | 4/2003 | Huibers | |
| 2003/0100190 A1* | 5/2003 | Cote et al. | 438/710 |
| 2003/0111263 A1 | 6/2003 | Fornof et al. | |
| 2003/0198742 A1 | 10/2003 | Vrtis et al. | |
| 2003/0224156 A1 | 12/2003 | Kirner et al. | |
| 2003/0224591 A1 | 12/2003 | Latchford et al. | |
| 2003/0232137 A1 | 12/2003 | Vrtis et al. | |
| 2004/0082164 A1* | 4/2004 | Chen et al. | 438/633 |
| 2004/0087133 A1 | 5/2004 | Kumar | |
| 2004/0094821 A1 | 5/2004 | Lur et al. | |
| 2004/0099951 A1* | 5/2004 | Park et al. | 257/758 |
| 2004/0099952 A1* | 5/2004 | Goodner et al. | 257/758 |
| 2004/0102031 A1 | 5/2004 | Kloster et al. | |
| 2004/0115876 A1* | 6/2004 | Goundar et al. | 438/200 |
| 2004/0214427 A1 | 10/2004 | Kloster et al. | |
| 2004/0241463 A1* | 12/2004 | Vincent et al. | 428/447 |
| 2005/0059254 A1* | 3/2005 | Shi et al. | 438/709 |
| 2005/0116346 A1 | 6/2005 | Kirner et al. | |
| 2005/0215065 A1* | 9/2005 | Nguyen et al. | 438/758 |
| 2005/0245100 A1* | 11/2005 | Wu et al. | 438/790 |
| 2005/0266691 A1* | 12/2005 | Gu et al. | 438/706 |
| 2006/0024976 A1* | 2/2006 | Waldfried et al. | 438/778 |
| 2006/0216920 A1* | 9/2006 | Kojima | 438/618 |
| 2007/0105247 A1* | 5/2007 | Mauersberger et al. | 438/16 |
| 2007/0259516 A1* | 11/2007 | Jahnes et al. | 438/618 |
| 2010/0001381 A1* | 1/2010 | Yun | 257/622 |

FOREIGN PATENT DOCUMENTS

| | | |
|---|---|---|
| EP | 0895276 A1 | 2/1999 |
| EP | 1 398 831 A2 | 3/2004 |
| JP | 2003-340799 A | 12/2003 |
| JP | 2004006822 A2 | 1/2004 |
| JP | 2004266244 A2 | 9/2004 |
| WO | 99/41423 A1 | 8/1999 |
| WO | 2005/104140 A1 | 11/2005 |

OTHER PUBLICATIONS

Hamaguchi, K., et al.; "3-nm Gap Fabrication using Gas Phase Sacrificial Etching for Quantum Devices"; IEEE; 2004; pp. 418-421.

Ji, Chang-Hyeon, et al.; "Electromagnetic Micromirror Array with Single-Crystal Silicon Mirror Plate and Aluminum Spring"; Journal of Lightwave Technology; vol. 21, No. 3; Mar. 2003; pp. 584-590.

Lopez, G., et al.; "In Situ Fabricated Mircochannels using Porous Polymer and Xenon DiFluoride Etchant", 1997.

Park, Joon-Shik, et al.; "Fabrication and Properties of PZT Micro Cantilevers using Isotropic Silicon Dry Etching Process by XeF2 Gas for Release Process"; Sensors and Actuators A 117; 2005; pp. 1-7.

Zheng, Jin-Yu, et al.; "Synthesis of Mesoporous Silican Materials with Hydroxyacetic Acid Derivatives as Templates via a Sol-Gel Process"; Journal of Inorganic and Organmetallic Polymers; vol. 10, No. 3; 2000; pp. 103-113.

Kloster, G., et al.; "Porosity Effects on Low-k Dielectric Film Strength and Interfacial Adhesion".

Winters, H.F., et al.; "The Etching of Silicon with XeF2 Vapor"; Appl. Phys. Lett.; vol. 34, No. 1; Jan. 1, 1979; pp. 70-73.

Aggarwal; "Comprehensive Polymer Science"; 2nd Supplement; pp. 71-132; 1996.

Hong, E., et al; "Fabrication of Micromachined Piezoelectric Diaphragm Pumps Actuated by Interdigitated Transducer Electrodes"; Mat. Res. Soc. Symp. Proc.; vol. 741; 2003; pp. J5.7.1-J5.7.6.

* cited by examiner

MATERIALS AND METHODS OF FORMING CONTROLLED VOID

CROSS-REFERENCE TO RELATED APPLICATIONS

This application claims benefit of U.S. Provisional Application No. 60/792,793, filed Apr. 18, 2006. The disclosure of this provisional application is hereby incorporated by reference.

BACKGROUND OF THE INVENTION

It is desirable in both the microelectronics and in nanotechnology industries to be able to deposit materials, which can act as fabrication aids, but which can be easily removed once fabrication is complete. One example of this in the nanotechnology area is the use of $SiO_2$ as a fabrication aid used to help fabricate silicon cantilever structures. Once the fabrication is complete, the $SiO_2$ can be removed by etching in aqueous HF without affecting the silicon. The use of aqueous solvents to remove the $SiO_2$, however, can cause collapsing of the small structures due to capillary effects, which arise during drying of the water, for example in cantilever fabrication. It has also been reported that the selective etching of silicon versus $SiO_2$ by $XeF_2$ can be used for this fabrication by capping the silicon with a thin organic membrane through which the $XeF_2$ can be diffused.

One example of the use of sacrificial materials in the microelectronics industry has been the use of a sacrificial organic material to introduce voids into an organosilicate glass (OSG) to make a porous OSG. The generation of these voids will effectively lower the dielectric constant of the material because the dielectric constant of air is 1.0, while the dielectric constant of the OSG material is generally >2.7. The lower limit for dielectric constant in microelectronic fabrication is achieved by incorporation of air gaps, which exhibit an effective dielectric constant of 1.0. The use of sacrificial organic layers is one promising way to realize this.

Air gaps can be formed within the semiconductor substrate in a variety of different ways. One method to form the air gap within a device is through the deposition of a poorly conformal material, which when deposited on top of a substrate with a space between raised surfaces forms air gaps or voids between those surfaces. In this connection, the air gap is formed within the spacing between a pair of interconnect lines, when the spacing is partially filled with a poorly conformal dielectric material, as shown in FIG. 1. The poorly conformal dielectric material may be deposited, for example, by chemical vapor deposition or other means. This process, however, may not be amenable to the current dual damascene process used in copper integration, for example see U.S. Pat. No. 6,057,226.

U.S. Pat. Apple. No. 2002/0149085; and U.S. Pat. Nos. 6,472,719 B1; 6,211,057 B1; 6,297,125 B1; 6,268,277 B1; 6,238,987 B1; and 6,228,763 B1, disclose methods wherein the sacrificial material is comprised of a spin-on glass or chemical vapor deposited oxide-containing material with a high HF etch rate, that is capped with a bridge layer having an opening formed therein. The spun-on material is then removed through the opening using buffered HF. See this technique in FIG. 2.

U.S. Pat. Apple. Nos. US20040099951 A1; US20040094821A1; 2002/1016888 and 2002/002563; and U.S. Pat. Nos. 6,316,347; 6,329,279; and 6,498,070; 6,713, 835 B1; 6,720,655 B1 disclose methods wherein the sacrificial material is an organic polymer capped by a bridge layer having one or more openings therein which is removed via a thermal anneal under an inert environment or "burning out" the polymer with an oxidizer such as molecular oxygen ($O_2$).

BRIEF SUMMARY OF THE INVENTION

The present invention is a process for forming an air gap within a substrate. In one embodiment of the present invention, the process comprising: providing a substrate; depositing a sacrificial layer with at least one organic precursor onto the substrate; depositing a layer of composite materials with a porogen that is the same at least one organic precursor in the sacrificial layer and at least one silica-containing precursor or OSG precursor onto the substrate; and applying energy to the substrate having the sacrificial layer and the layer of composite materials to remove both the sacrificial layer to provide air gapes and the porogen to form a porous layer.

In another embodiment of the present invention, the process comprising: providing a substrate; providing a substrate; depositing a sacrificial layer comprising silicon; depositing a composite layer with a porogen and at least one silica-containing precursor or organosilicate glass (OSG) precursor; applying energy to the substrate having the sacrificial layer and the composite layer to remove the porogen to form a porous layer; and contacting the substrate having the sacrificial layer and the porous layer with a fluorine containing reagent under reduced pressure capable of diffusing through the porous layer to selectively remove the sacrificial layer to form air gaps.

In yet another embodiment of the present invention, the process comprising: providing a substrate; depositing a polar solvent soluble metal oxide sacrificial layer with a metal precursor; depositing a composite layer with a porogen and at least one silica-containing precursor or organosilicate glass (OSG) precursor; applying energy to the substrate having the sacrificial layer and the composite layer to remove the porogen to form a porous layer; and contacting the substrate having the sacrificial layer and the porous layer with a polar solvent capable of diffusing through the porous layer to remove the sacrificial layer to form air gaps.

And yet in another embodiment of the present invention, the process comprising: providing a substrate; depositing a polar solvent soluble metal oxide sacrificial layer with a metal precursor; depositing a composite layer with a porogen that is the same polar solvent soluble metal oxide in the sacrificial layer and at least one silica-containing precursor or organosilicate glass (OSG) precursor; contacting the substrate having the sacrificial layer and the composite layer with a polar solvent to remove the porogen to form a porous layer and to remove the sacrificial layer to form air gaps.

DETAILED DESCRIPTION OF THE INVENTION

Figure 1:
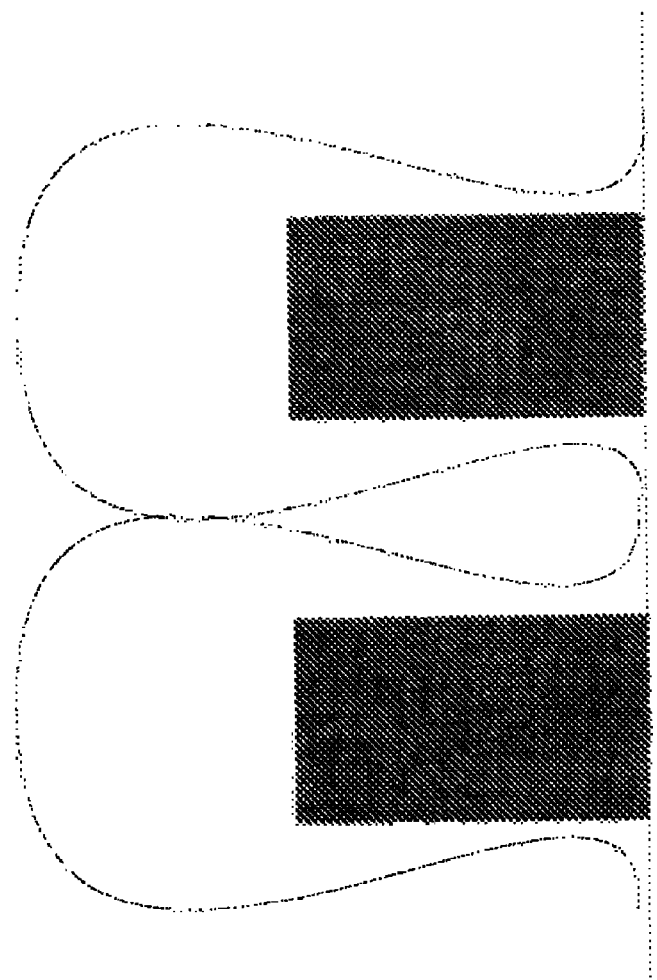
FIG. 1 Shows a cross section view of an air gap formed by poor step coverage of the prior art.
Figure 2:
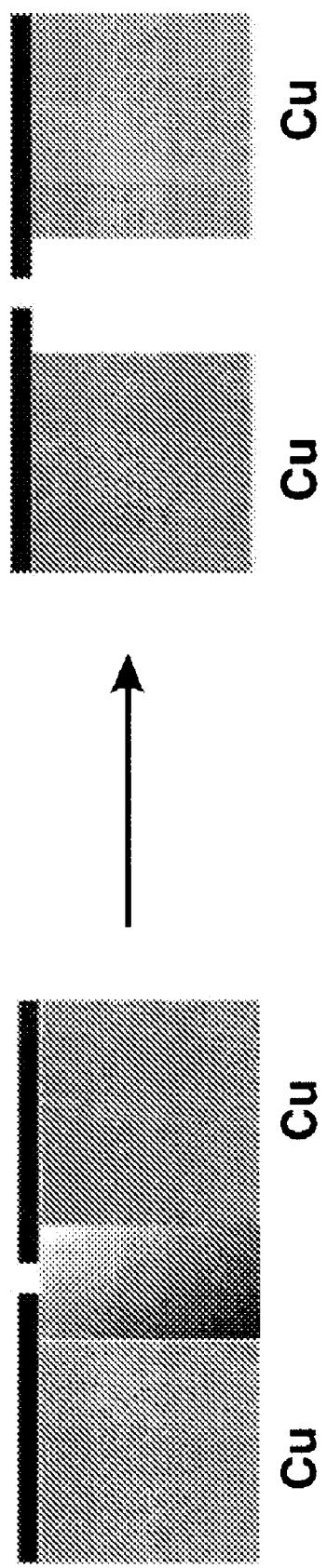
FIG. 2 Shows a cross sectional view of an air-gap structure formed by removing material through an aperture in the bridging layer of the prior art.

As electronic device dimensions continue to shrink, there is a need for interlayer dielectric (ILD) materials with ever lower dielectric constants. Over the past 12 years there has been a progression of dielectric materials from $SiO_2$, to FSG's, to OSG's and now to porous OSG's with dielectric constants as low as 2.0. In order to achieve dielectric constants down to 2.0 it is necessary to incorporate 25% or more porosity into the OSG films. As the amount of porosity incorporated into the OSG films increases it not only lowers the dielectric constant, but it causes an even greater decrease in mechanical properties.

For example, a dense OSG film with a dielectric constant of 2.9 has a mechanical hardness of ~3.0 GPa, while with our PDEMS™ technology (see for example U.S. Pat. Nos. 6,583,048 and 6,846,515, which are incorporated herein by reference) a porous OSG material with ~25% porosity has a dielectric constant of 2.2, but a mechanical hardness of only 0.8 GPa. Extrapolating this trend to even lower dielectric constants, it is likely that a material with a dielectric constant below 1.9 may have a mechanical hardness of less than 0.3 GPa. Another trend which we have observed is that: as the percent porosity increases there is a corresponding increase in the interconnect path length. The interconnect pathlength, as measured by Positron Annihilation Lifetime Spectroscopy (PALS), is a measure of the longest distance a positronium element can travel without encountering a wall, or the longest string of connected pores. This interconnectedness is thought to be important for atomic layer deposition (ALD) considerations, as well as for interactions with wet processes such as resist developers, resist strippers and CMP slurries. Therefore, it is thought that at some point below a k of ~1.9 the ILD offers little in the way of mechanical or barrier resistance and the difference between a highly porous OSG film and an air gap begins to diminish.

To date, the fabrication of air gaps has focused on three main avenues: (i) the use of extremely non-conformal $SiO_2$ depositions that result in large key-hole structures as the air gaps, (ii) the use of thermally labile polymeric materials deposited by either spin-on processes or CVD (iii) isotropic etching of air gaps either by reactive ion etching using $O_2$ plasma of an underlying film or via a wet etch using HF.

The present invention describes three alternative approaches for fabricating air gap, or void space, structures. All three routes utilize the ability of liquids or gases to diffuse through a porous OSG or $SiO_2$ layer. The porosity of this layer can range from 0.1 to 99 volume percent porosity, more generally from 10-50 volume % porosity. The first approach utilizes an organic sacrificial material to create the air gap. This is an extension of a porous dielectric layer using as an example the patented PDEMS™ product, which was developed for making porous OSG films. In this approach, the sacrificial layer and the porogen co-deposited with the OSG in the composite layer process are formed from the same organic precursor. In this manner one organic material can be utilized for both the sacrificial layer and to generate the porous OSG. A second approach, similar to the first, employs a porous capping layer over a sacrificial material comprised of silicon. In this approach the sacrificial layer is covered with a composite layer either before or after patterning, and after the porogen is removed to yield a porous $SiO_2$ or OSG layer, the fabricated pieces is then exposed to a gas which will selectively etch silicon versus $SiO_2$ or OSG, such as $XeF_2$ or $BrF_3$, which can diffuse through the porous $SiO_2$ or OSG layer to remove the silicon structure below leaving a void. The third method employs the use of a sacrificial inorganic material such as $GeO_2$ or $B_2O_3$, which is soluble in a polar solvent (i.e., water). In this approach the sacrificial layer is covered with a composite layer either before or after patterning, and after the porogen is removed to yield a porous $SiO_2$ or OSG layer, the fabricated pieces is then then exposed to water or other such polar solvent, which can diffuse through the porous $SiO_2$ or OSG layer to remove the soluble inorganic material (i.e. $GeO_2$ or $B_2O_3$) leaving a void It may be advantageous to add a surfactant to the water or polar solvent to enhance the diffusion through the porous layer, especially if the porous layer is a hydrophobic OSG material.

The following are non-limiting examples of silica-based precursors suitable for use with the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1{}_n(OR^2)_{4-n}Si$, when n is 2 or 3, the two or three $R^1$ groups need not be identical to each other or to $R^2$.

$R^1{}_n(OR^2)_{3-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane $R^1{}_n(OR^2)_{3-n}Si—O—SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane $R^1{}_n(OR^2)_{3-n}Si—SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraethoxydisilane $R^1{}_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane $R^1{}_n(O(O)CR^2)_{3-n}Si$—O—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane $R^1{}_n(O(O)CR^2)_{3-n}Si$—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane $R^1{}_n(O(O)CR^2)_{3-n}Si$—O—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane $R^1{}_n(O(O)CR^2)_{3-n}Si$—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane $R^1{}_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane $R^1{}_n(OR^2)_p(O(O)CR^4)_{3-n-p}Si$—O—$SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-dimethyl-1,3-diacetoxy-1,3-diethoxydisiloxane $R^1{}_n(OR^2)_p(O(O)CR^4)_{3-n-p}Si$—$SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-dimethyl-1,2-diacetoxy-1,2-diethoxydisilane cyclic siloxanes of the formula $(OSiR_1R_3)_x$, where $R^1$ and $R^3$ can be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

Other precursors which can be used for the $SiO_2$ or OSG deposition are for examples: TEOS, triethoxysilane, di-tertiarybutoxysilane, silane, disilane, di-tertiarybutoxydiacetoxysilane, etc.

The present invention is directed to the use of a sacrificial material deposited by any of a plurality of traditional methods known in the electronics fabrication industry to be used as a sacrificial layer in the fabrication of a void space. This layer is particularly useful in the fabrication of air gap structures in the microelectronics industry and for "releasing" structures or fabricating void spaces in nanotechnology fabrication.

Semiconductor substrates having one or more air gap structures contained therein and methods for forming same are described herein. In one embodiment, the one or more air gaps are formed within at least a portion of the spacing between conductive lines within a layered substrate. The term "conductive lines", as used herein, relates generally to metal lines, traces, wire, interconnect lines, signal paths, or signaling medium that provide signal paths for coupling or interconnecting electrical circuitry within the substrate. The structure is readily scalable to multiple levels and is compatible with Single or Dual Damascene processing. In certain embodiments, dielectric layer may be a solid material or alternatively may be porous and/or contain voids, cavities or air-gaps.

FIRST EMBODIMENT

Organic Labile Sacrificial Materials

In this embodiment a sacrificial organic layer is used to create the void space. By using the at least one same organic precursor for deposition of both the sacrificial layer and for use as a porogen in the composite layer, for example a PDEMS™ layer it allows for a gradient to be built into the device. Because the same precursor is used as the organic precursor for the sacrificial layer and the as the organic porogen precursor the PECVD process can be run initially using just the at least one organic precursor followed by flowing an additional at least one OSG precursor a seamless gradient can be formed between the sacrificial layer and the porous layer. U.S. Pat. Nos. 6,583,048 and 6,846,515, 6,054,206, 6,054,379, 6,171,945, and WO 99/41423 provide some exemplary CVD methods that may be used to form the organosilicate film of the present invention.

Without being bound by theory the nature of the organic precursor used to deposit both the porogen in the composite layer and as the sacrificial layer has certain desirable attributes. The organic precursor should be able to be delivered into the reaction chamber in the gaseous form, therefore it is desirable that the organic precursor have a measurable vapor pressure at temperatures of 50° C. or more. It is desirable that the organic precursor should react in the chamber in such a way that it forms a material which does not have a significant vapor pressure at temperatures of 100° C. or more, more preferable, it is desirable that the porogen react to form a material which does not have an appreciable vapor pressure above 200° C.

The number of degrees of unsaturation in an organic molecule are defined as the number of multiple bonds or the number of ring structures in the molecule. Thus a single double bond or a simple ring structure in a molecule is one degree of unsaturation while a triple bond or a double bond in a ring structure is two degrees of unsaturation. The number of degrees of unsaturation in the organic precursor will affect the deposition reaction, with higher number of degrees of unsaturation generally resulting in higher deposition rates. Without being limited by theory, however, it is generally observed that materials deposited from organic precursors with higher degrees of unsaturation are more difficult to remove completely, therefore a balance must be found between deposition and removal.

In some cases, it may be favorable to have a hetero-atom (e.g. oxygen, nitrogen, or sulfur) in the molecule, which may enhance deposition of the porogen or sacrificial material. It is believed that in a plasma environment, the hetero-atom will increase the electron capture cross section, and thus, increase the number of neutral radicals in the gas phase. This increase in the number of neutral radicals will increase the deposition efficiency, as the deposition is believed to be based on the reactions of neutral radicals.

The following are non-limiting examples of materials suitable for use as organic precursors of the invention:

1) Cyclic hydrocarbons of the general formula $C_nH_2n$ where n=4-14, where the number of carbons in the cyclic structure is between 4 and 10, and where there can be a plurality of simple or branched hydrocarbons substituted onto the cyclic structure.

Examples include: cyclohexane, 1,2,4-trimethylcyclohexane, 1-methyl-4-(1-methylethyl)cyclohexane, cyclooctane, methylcyclooctane, etc.

2) Linear or branched, saturated, singly or multiply unsaturated hydrocarbons of the general formula $C_nH_{(2n+2)-2y}$ where n=2-20 and where y=0-n.

Examples include: ethylene, propylene, acetylene, neohexane, 1,3-butadiene, 2-methyl-1,3-butadiene, 2,3-dimethyl-2,3-butadiene, substituted dienes etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include, cyclooctene, 1,5-cyclooctadiene, cyclohexene, vinyl-cyclohexane, dimethylcyclohexene, alpha-terpinene, pinene, limonene, vinyl-cyclohexene, etc.

4) Bicyclic hydrocarbons of the general formula $C_nH_{2n-2}$ where n=4-14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, 5-Ethylidene-2-norbornene etc.

6) Tricyclic hydrocarbons of the general formula $C_nH_{2n-4}$ where n=4-14, where the number of carbons in the tricyclic structure is between 4 and 12, and where there can be a plurality of simple or branched hydrocarbons substituted onto the cyclic structure.

Examples include adamantane.

7) Hydrocarbon structures containing one or more alcohol groups and having the general formula $C_nH_{2n+2-2x-2y-z}(OH)_z$ where n=1-12, and where x is the number of cyclic rings in the structure and is between 0 and 4, and where y is the number of unsaturated bonds in the structure and is between 0 and n, and where z is the number of alcohol groups in the compounds and is between 1 and 4, and where the alcohol functionality can be exo- and/or endocyclic. Examples: propanol (n=3, x=0, y=0, z=1), ethylene glycol (n=2, x=0, y=0, z=2), hexanol (n=6, x=0, y=0, z=1), cyclopentanol (n=5, x=1, y=0, z=1), 1,5-hexadiene-3,4-diol (n=6, x=0, y=2, z=2), cresol (n=7, x=1, y=3, z=1), and resorcinol (n=6, x=1, y=3, z=2), etc.

8) Hydrocarbon structures containing one or more ether groups and having the general formula $C_nH_{2n+2-2x-2y}O_z$ where n=1-12, and where x is the number of cyclic rings in the structure and is between 0 and 4, and where y is the number of unsaturated bonds in the structure and is between 0 and n, and where z is the number of ether linkages in the structure and is between 1 and 4, and where the ether linkage(s) can be exo- and/or endocyclic. Examples: diethylether (n=4, x=0, y=0, z=1), 2-methyl-tetrahydrofuran (n=5, x=1, y=0, z=1), 2,3-benzofuran (n=8, x=2, y=4, z=1), ethylene glycol divinyl ether (n=6, x=0, y=2, z=2), cineole (eucalyptol) (n=10, x=2, y=0, z=1), etc.

9) Hydrocarbon structures containing one or more epoxide groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of epoxide groups in the structure and is between 1 and 4, and where the epoxide groups can be attached to a cyclic ring or a linear chain. Examples: 1,2-epoxy-3-methylbutane (n=5, x=0, y=0, z=1), 1,2-epoxy-5-hexene (n=5, x=0, y=1, z=1), cyclohexene oxide (n=6, x=1, y=0, z=1), 9-oxabicyclo[6.1.0]non-4-ene (n=8, x=1, y=1, z=1), etc.

10) Hydrocarbon structures containing one or more aldehyde groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4. Examples: Cyclopentanecarboxaldehyde (n=5, x=1, y=0, z=1), etc.

11) Hydrocarbon structures containing one or more ketone groups and having the general formula $C_nH_{2n+2-2x-2y-2z}O_z$ where n=1-12, and where x is the number of cyclic rings in the structure and is between 0 and 4, and where y is the number of unsaturated bonds in the structure and is between 0 and n, and where z is the number of aldehyde groups in the structure and is between 1 and 4, and where the ketone group(s) can be exo- and/or endocyclic. Examples: 3,4-hexanedione (n=6, x=0, y=0, z=2), cyclopentanone (n=5, x=1, y=0, z=1), mesityloxide (n=6, x=0, y=1, z=1), etc.

12) Hydrocarbon structures containing one or more carboxylic acid groups and having the general formula $C_nH_{2n+2-2x-2y-3z}(OOH)_z$ where n=1–12, and where x is the number of cyclic rings in the structure and is between 0 and 4, and where y is the number of unsaturated bonds in the structure and is between 0 and n, and where z is the number of carboxylic acid groups in the structure and is between 1 and 4. Examples: cyclopentanecarboxylic acid (n=6, y=1, x=0, z=1), etc.

13) Hydrocarbon structures containing an even number of carboxylic acid groups and in which the acid functionality is dehydrated to form a cyclic anhydride group where the structures have the general formula $C_nH_{2n+2-2x-2y-6z}(O_3)_z$ where n=1–12, and where x is the number of cyclic rings in the structure and is between 0 and 4, and where y is the number of unsaturated bonds in the structure and is between 0 and n, and where z is the number of anhydride groups in the structure and is 1 or 2. Examples: maleic anhydride (n=2, x=0, y=1, z=1), etc.

14) Hydrocarbon structures containing an ester group with the general formula $C_nH_{2n+2-2x-2y-2z}(O_2)_z$ where n=1–12, and where x is the number of cyclic rings in the structure and is between 0 and 4, and where y is the number of unsaturated bonds in the structure, and where none of the unsaturated bonds are conjugated with the carbonyl group of the ester, and where z is the number of anhydride groups in the structure and is 1 or 2. Examples: etc.

15) Hydrocarbon structures containing an acrylate functionality consisting of an ester group and at least one unsaturated bond that is conjugated with the carbonyl of the ester group, and having the general formula $C_nH_{2n+2-2x-2y-2z}(O_2)_z$ where n=1–12, and where x is the number of cyclic rings in the structure and is between 0 and 4, and where y is the number of unsaturated bonds in the structure and is greater than or equal to 1, and where at least of the unsaturated bonds are conjugated with the carbonyl group of the ester, and where z is the number of ester groups in the structure and is 1 or 2. Examples: ethylmethacrylate (n=6, x=0, y=1, z=1), etc.

16) Hydrocarbon structures containing both ether and a carbonyl functional groups and having the general formula $C_nH_{2n+2-2w-2x-2y}(O)_y(O)_z$ where n=1–12, and where w is the number of cyclic rings in the structure and is between 0 and 4, and where x is the number of unsaturated bonds in the structure and is between 0 and n, and where y is the number of carbonyl groups in the structure in which the carbonyl group can be ketones and/or aldehydes, and where z is the number of ether groups in the structure and is 1 or 2, and where the ether group(s) can be endocyclic or exocyclic. Examples: ethoxymethacrolein (n=6, w=0, x=1, y=1, z=1), etc.

17) Hydrocarbon structures containing both ether and alcohol functional groups and having the general formula $C_nH_{2n+2-2w-2x-y}(OH)_y(O)_z$ where n=1–12, and where w is the number of cyclic rings in the structure and is between 0 and 4, and where x is the number of unsaturated bonds in the structure and is between 0 and n, and where y is the number of alcohol groups in the structure, and where z is the number of ether groups in the structure and is 1 or 2, and where the ether group(s) can be endocyclic or exocyclic. Examples: 3-hydroxytetrahydrofuran, etc.

18) Hydrocarbon structures containing any combination of functional groups selected from the following list: alcohol, ether, carbonyl, and carboxylic acid and having the general formula $C_nH_{2n+2-2u-2v-w-2y-3z}(OH)_w(O)_x(O)_y(OOH)_z$ where n=1–12, and where u is the number of cyclic rings in the structure and is between 0 and 4, and where v is the number of unsaturated bonds in the structure and is between 0 and n, and where w is the number of alcohol groups in the structure and is between 0 and 4, and where x is the number of ether groups in the structure and is between 0 and 4 and where the ether group(s) can be endocyclic or exocyclic, and where y is the number of carbonyl groups in the structure and is between 0 and 3 in which the carbonyl group can be ketones and/or aldehydes, and where z is the number of carboxylic acid groups in the structure and is between 0 and 2.

19) Hydrocarbon structures containing one or more primary amine groups and having the general formula $C_nH_{2n+2-2x-2y-z}(NH_2)_z$ where n=1–12, and where x is the number of cyclic rings in the structure and is between 0 and 4, and where y is the number of unsaturated bonds in the structure and is between 0 and n, and where z is the number of amine groups in the compounds and is between 1 and 4, and where the amine functionality can be exo- and/or endocyclic. Examples: cyclopentylamine (n=5, x=1, y=0, z=1), etc.

20) Hydrocarbon structures containing one or more secondary amine groups and having the general formula $C_nH_{2n+2-2x-2y-2z}(NH)_z$ where n=1–12, and where x is the number of cyclic rings in the structure and is between 0 and 4, and where y is the number of unsaturated bonds in the structure and is between 0 and n, and where z is the number of secondary amine groups in the compounds and is between 1 and 4, and where the amine functionality can be exo- and/or endocyclic. Examples: diisopropylamine (n=6, x=0, y=0, z=1), piperidine (n=5, x=1, y=0, z=1), pyride (n=5, x=1, y=3, z=1), etc.

21) Hydrocarbon structures containing one or more tertiary amine groups and having the general formula $C_nH_{2n+2-2x-2y-3z}(N)_z$ where n=1–12, and where x is the number of cyclic rings in the structure and is between 0 and 4, and where y is the number of unsaturated bonds in the structure and is between 0 and n, and where z is the number of tertiary amine groups in the compounds and is between 1 and 4, and where the amine functionality can be exo- and/or endocyclic. Examples: triethylamine (n=6, x=0, y=0, z=1), N-methylpyrrolidine (n=5, x=1, y=0, z=1), N-methylpyrrole (n=5, x=1, y=2, z=1), etc.

22) Hydrocarbon structures containing one or more nitro groups and having the general formula $C_nH_{2n+2-2x-2y-z}(NO_2)_z$ where n=1–12, and where x is the number of cyclic rings in the structure and is between 0 and 4, and where y is the number of unsaturated bonds in the structure and is between 0 and n, and where z is the number of nitro groups in the compounds and is between 1 and 4, and where the nitro functionality can be exo- and/or endocyclic. Examples: nitrocyclopentane (n=5, x=1, y=0, z=1), nitrobenzene (n=6, x=1, y=3, z=1), etc.

23) Hydrocarbon structures having both amine and ether functional groups having the general formula $C_nH_{2n+2-2u-2v-w-2x-3y-z}(NH_2)_w(NH)_x(N)_y(OH)_z$ where n=1–12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where 1<w+x+y<4, and where z is the number of alcohol groups in the compound and is between 1 and 4, and where the alcohol and/or amine groups can be exo- and/or endocyclic. Examples: 2-(2-aminoethylamino)ethanol (n=4, u=0, v=0, w=1, x=1, y=0, z=1), N-methyl morpholine (n=5, u=1, v=0, w=0, x=0, y=1, z=1), etc.

24) Hydrocarbon structures having both amine and alcohol functional groups having the general formula $C_nH_{2n+2-2u-2v-w-2x-3y-z}(NH_2)_w(NH)_x(N)_y(OH)_z$ where n=1–12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where $1<w+x+y<4$, and where z is the number of ether groups in the compound and is between 1 and 4, and where the ether and/or amine groups can be exo- and/or endocyclic. Examples: tetrahydrofurfurylamine (n=5, u=1, v=0, w=1, x=0, y=0, z=1), etc.

25) Hydrocarbon structures having both amine and carbonyl functional groups having the general formula $C_nH_{2n+2-2u-2v-w-2x-3y-2z}(NH_2)_w(NH)_x(N)_y(O)_z$ where n=1–12, and where u is the number of cyclic rings in the structure and is between 0 and 4, and where v is the number of unsaturated bonds in the structure and is between 0 and n, and where w is the number of primary amine groups, x is the number of secondary amine groups, y is the number of tertiary amine groups, and where $1<w+x+y<4$, and where z is the number of carbonyl groups in the compound and is between 1 and 4, and where the carbonyl groups can be aldehyde(s) and/or ketone(s), and where the carbonyl and/or amine groups can be exo- and/or endocyclic. Examples: N,N-diethylformamide (n=5, u=0, v=0, w=0, x=0, y=1, z=1), (dimethylamine)acetone (n=5, u=0, v=0, w=0, x=0, y=1, z=1), N-methylpyrollidinone (n=5, u=1, v=1, w=0, x=0, y=1, z=1), etc.

Figure 3:
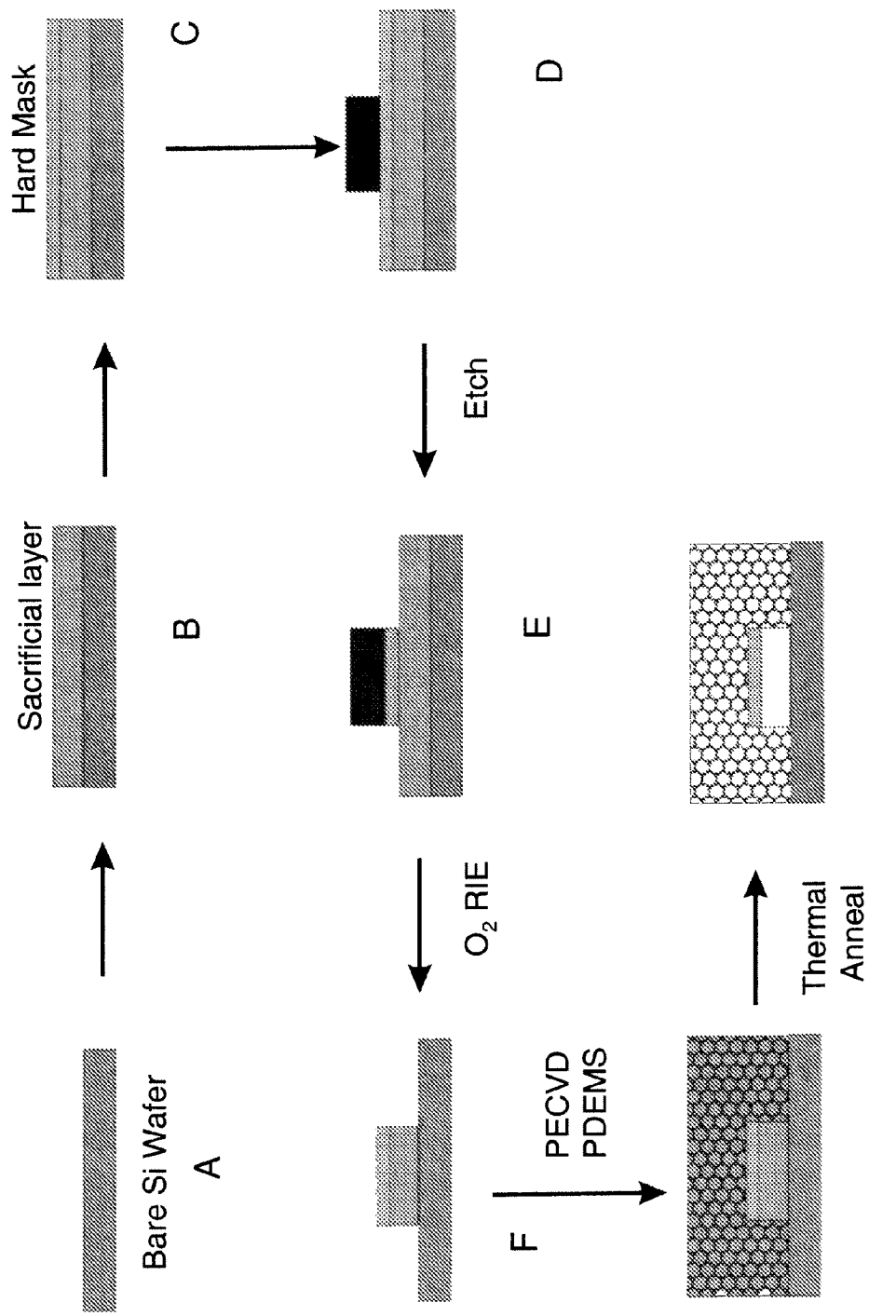
FIG. 3 Shows a cross sectional view illustrating progressive steps of a method for forming a structure of the present invention using applied energy to remove the sacrificial material in the void space.

This technique is illustrated in FIG. 3A-H and Example 4 with regard to using the at least one same organic precursor to deposit both the sacrificial layer and the porogen in the composite layer. In FIG. 3A a bare silicon wafer is represented, although this could be at any stage in the fabrication of a microelectronic or nanotechnology device. The first step is the deposition of the sacrificial layer via PECVD utilizing the at least one organic precursor as shown in FIG. 3B. On top of this sacrificial layer is deposited a hard mask which can be any material which has good etch selectivity to photoresist and the sacrificial layer, in FIG. 3C a composite film deposited from DEMS and Limonen is used as a hard mask is depicted. The next step, as shown in FIG. 3D, is the application of a pattern transfer layer, this can be accomplished by a number of various techniques, for example by the application, exposure, and development of a photoresist or by nano-imprint transfer, or possibly via ink-jet technology depending on the application. FIG. 3E depicts the structure after the hard mask is etched away, this can be by for example RIE or wet etch. Next the pattern is transferred onto the sacrificial layer by, for example $O_2$ RIE as shown in FIG. 3F, in this step it may be advantageous to engeneer the etch rate and thickness of the pattern transfer material (i.e. photoresist) such that the pattern transfer material above the hard mask is completely removed as the sacrificial layer is being etched this limiting the need for an ashing step which may negatively impact the sacrificial layer. After the sacrificial layer is patterned, a composite layer of PDEMS™ is then deposited over the top of this feature by PECVD as shown in FIG. 3G, utilizing the same at least one organic precursor as was used to deposit the sacrificial layer, thus ensuring the ability of the sacrificial layer through the porous OSG layer. Finally, the porogen and sacrificial layer are removed by any of a number of techniques, the thermal annealing technique is described in FIG. 3H.

Figure 9A:
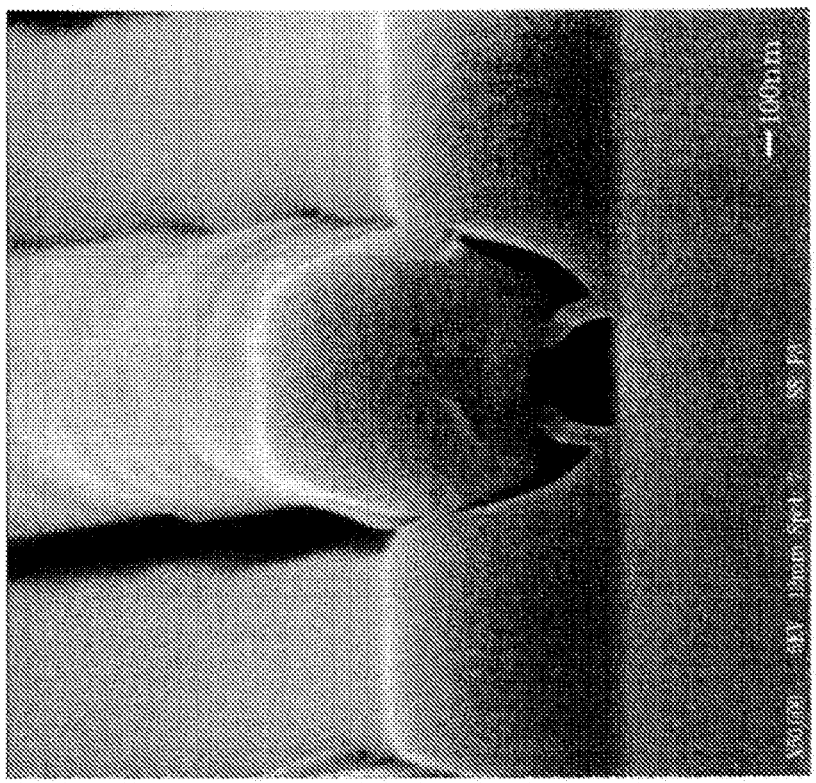
FIGS. 9A, 9B, and 9C are scanning electron microscope images of actual structures fabricated with void spaces using the present invention.
Figure 9A:
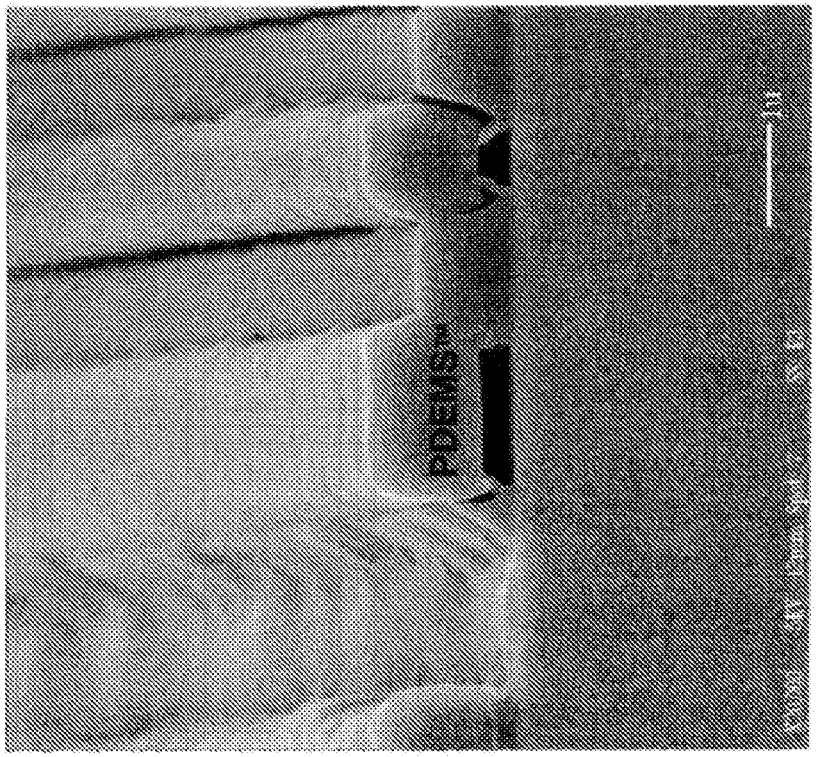

Cross sections of the films were measured by SEM to determine how well the sacrificial organic material were removed through the porous OSG layer. FIG. 9A shows the SEM photographs after thermal annealing to remove the sacrificial material leaving behind "tunnels" in the porous OSG network.

SECOND EMBODIMENT

Sacrificial Materials of Selectively Etched Silicon

It is known that a fluorine containing selective etching gas (for example $XeF_2$ or $BrF_3$) in the gas phase, will selectively etch silicon versus silicon dioxide, for example see Lopez et. al. in Micro Total Analysis Systems 2002, Proceedings of the µTAS 2002 Symposium, 6th, Nara, Japan, Nov. 3-7, 2002 (2002), 2 934-936 The etch selectivity results from the increased chemical reactivity of single crystal- poly- or amorphous-silicon with the $XeF_2$, $BrF_3$ etc being used. One example of this type of fabrication would be to form a cantilever by depositing a layer of poly-silicon into $SiO_2$ on Silicon and then coating with a second layer of $SiO_2$ on top of the poly-silicon, after patterning and etching both the top $SiO_2$ layer and the poly-silicon layer the cantilever can be released by selectively etching the poly-silicon layer using $XeF_2$. In this example the poly-silicon is etched from the edges inward as the $XeF_2$ diffuses under the $SiO_2$ cantilever.

In this second embodiment of the present invention the fluorine containing selective etching gas diffuse though a porous silicate or porous OSG capping layer which is formed over a poly- or amorphous-silicon layer to etch the underlying poly- or amorphous-silicon without having to open the structure and etch the underlying layer around the top layer (i.e without the need for lateral diffusion). In this manner the silicon layer can be removed without having to open a pathway for diffusion of the etch gas.

Examples for possible uses for this technology are: formation of air gaps in semiconductor manufacturing, formation of tunnels for the delivery of gases or liquids for example for use in drug delivery by microcaprillary fabrication, or for the formation of a hollow core in the fabrication of advanced fiber optic cables. The ability to build multiple layers of porous $SiO_2$ or porous OSG and silicon before the silicon is removed allows for the ability of fabricating interconnecting layers of microcapilaries which could interact in a manner similar to the circuitry in a microchip, especially for chemistry on a chip.

Figure 4:
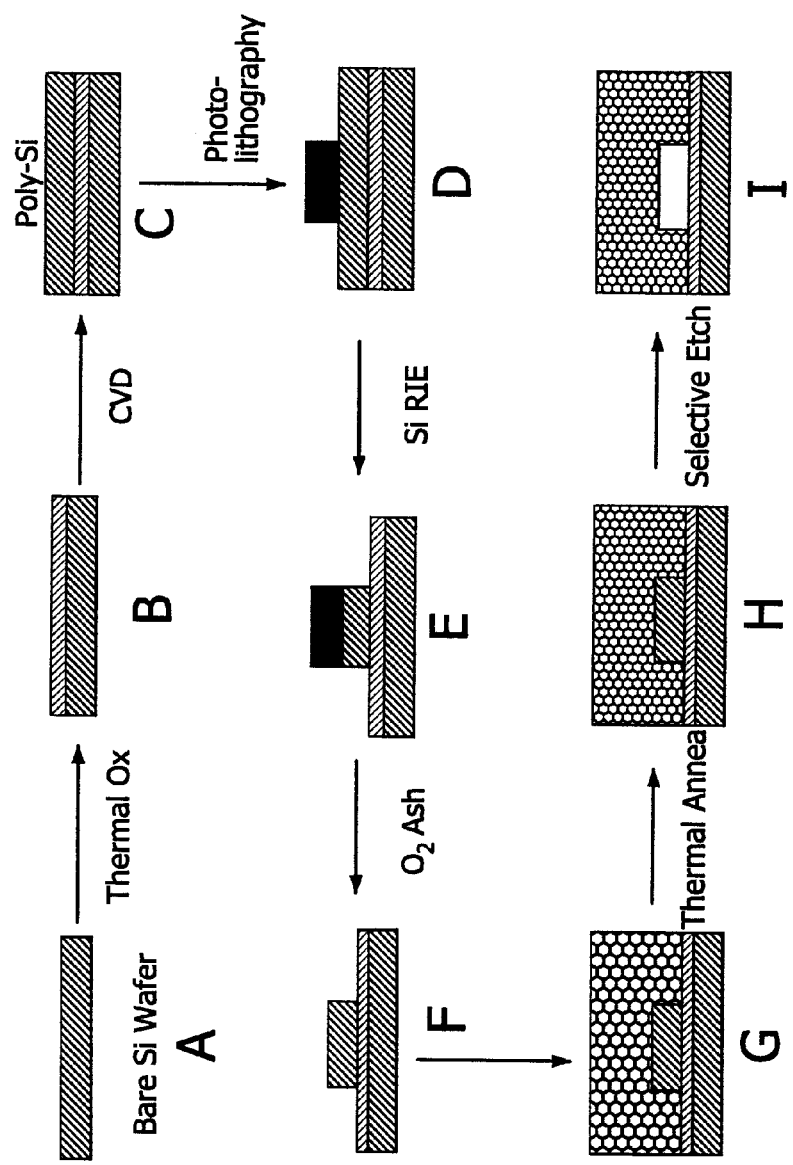
FIG. 4 Shows a cross section view illustrating progressive steps of an alternate method and embodiment of the present invention using a selective etching reagent, $BrF_3$, to remove a silicon sacrificial material in the void space.

FIG. 4A-I shows on exemplary pathway for the formation of void. In this process a silicon wafer (FIG. 4A) is thermally oxidized in oxygen ambient to form a layer of $SiO_2$ which is necessary to prevent the selective fluorine etching gas from reacting with the silicon wafer itself (FIG. 4B), if a non-silicon underlayer is used this step is not necessary. Onto this $SiO_2$ a layer of poly-silicon can be deposited for example using a high temperature thermal CVD from silane (FIG. 4C). The next step, as shown in FIG. 4D, is the application of a pattern transfer layer, this can be accomplished by a number of various techniques, for example by the application, exposure, and development of a photoresist, or by nono-imprint transfer, or possibly via ink-jet technology depending on the application. FIG. 4E depicts the structure after the silicon layer is etched, this can be by for example RIE or using for example $Cl_2$, or HBr. Next the pattern transfer material (i.e. photoresist) is removed in an ashing step, a number of different processes can be used in the ashing step, ie a $O_2$ reactive ion etching step, a $O_2$ downstream ash, a reducing ash such as a $H_2$ or $NH_3$ downstream ash, or a UV assisted ash etc. These lines were then coated with a composite silica or OSG as shown in FIG. 4G. Any number of processes can be utilized to form this composite layer, for example: using a spin coater and Meso-ELK product (Air Products and Chemicals, Inc., Allentown, Pa.), as described in U.S. Pat. Nos. 6,365,266; 6,592,980; 6,818,289 and 6,942,918, which are incorporated herein by reference; or deposited via PECVD in a PDEM™ process (Air Products and Chemicals, Inc., Allentown, Pa.), as described in U.S. Pat. Nos. 6,583,048 and 6,846,515. The porogen used to form the porous silica or porous OSG in then removed in an anneal step as shown in FIG. 4H, this anneals step can be any number of processes, for example thermal annealing under an inert atmosphere, thermal annealing under an oxidizing atmosphere, thermal annealing under vacuum, reactive ion such as $O_2$ plasma, UV annealing under atmospheric or reduced pressures etc. These samples were then exposed to $BrF_3$ at 10 Torr and room temperature for a period of time as shown in FIG. 4I.

Other selective etchants for silicon to form the air gap contemplated by the present invention include: HF, noble gas halides, interhalogens, such as $IF_5$, $BrCl_3$, $IF_7$ and $ClF_3$.

The selectivity of the $BrF_3$ and $XeF_2$ etching for silicon over $SiO_2$ or OSG is temperature dependant with lower temperatures resulting in greater selectivity.

Figure 9B:
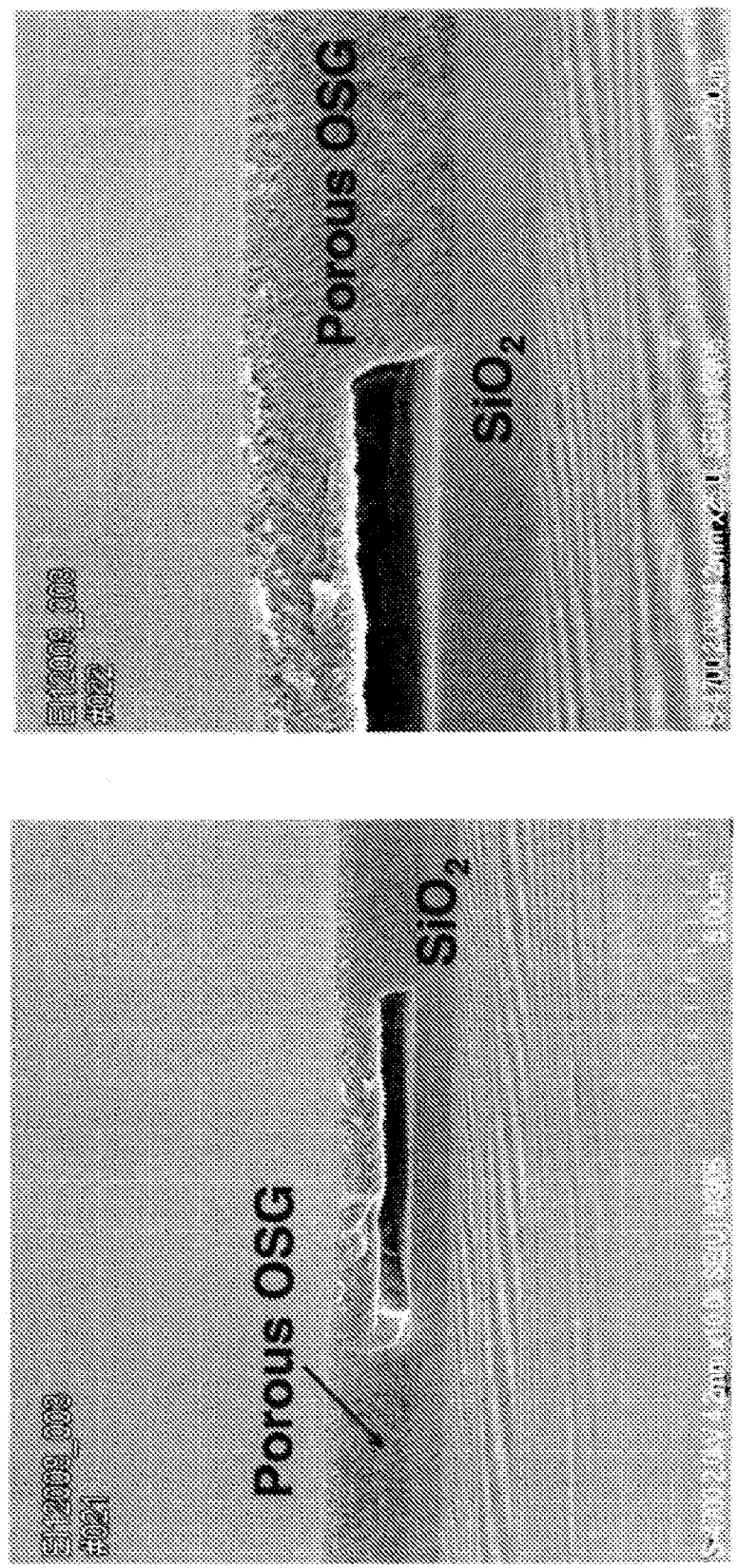

FIG. 9B shows the SEM photographs after exposure of the structure to $BrF_3$ to remove the sacrificial silicon material leaving behind "tunnels" in the porous OSG network.

Without being bound by theory it might be possible to fabricate the entire semiconductor device with the silicon in place, then after wafer dicing, expose the chip to the selective fluorine containing etching gas to remove the silicon and selectively create the air gaps, this may offer advantages in mechanical integrity during packaging which is a major issue for materials with low mechanical integrity.

For use in the manufacture of devices with liquid or gas channels it could be envisioned that the poly- or amorphous silicon layers could be etched into a pattern allowing for mixing of chemicals at given points along the wafer, by allowing for multiple layers of channels it could be possible to do multiple step synthesis of molecules on a single chip. Once the desired structure of porous silica or OSG and poly- or amorphous-silicon layers were fabricated the device would be exposed to selective fluorine containing etching gas in order to etch away the silicon to leave open channels. It may be advantageous to fill up the pores in the porous silica or OSG layers, if necessary, to prevent diffusion of the gases or liquids though the porous layer from one channel to another. One way this might be done is to fill the pores with a polymizable organic species, such as a liquid which can be activated towards polymerization effectively filling the pores. This process is facilitated by the capillary effect which will render liquid inside the pores less volatile than material in the channels.

The fabrication of hollow core fiber optic cables is advantageous because of the large difference in refractive indexes (RI's) between air (RI=1) and a porous silica or OSG (RI=1.2-1.46), this difference will allow greater signal densities and decrease the signal loss compared to conventional solid core fiber optic cables. To fabricate a hollow core fiber optic cable one could envision first forming a thin strand of poly- or amorphous-silicon and then coating this with a composite silica or OSG layer followed by removal of the porogen in an annealing step. The silicon core could then be etched away using a selective fluorine containing etching gas. It may be advantageous to then further coat this hollow core fiber with any of another layer in order to provide mechanical strength.

THIRD EMBODIMENT

Sacrificial Materials Solvated in Polar Solvents

The use of a porous silicate layer and a water soluble metal oxide, such as germanium oxide ($GeO_2$), to fabricate structures is also contemplated as an embodiment of the present invention. It is known that $GeO_2$ is a water soluble oxide material, and that $GeO_2$ can be deposited by any of a number of techniques such as chemical vapor deposition or PECVD from readily available precursor materials or from spin-on techniques usign pre-oxides followed by an anneal step. Examples of precursors for the formation of a water soluble metal oxide are materials such as, but not limited to, germanium (Ge) based precursor is selected from the group consisting of tetra-methyl germane, germane, tetra-methoxy germanium and tetra-ethoxy germanium; and the boron (B) based precursor is selected from the group consisting of tri-methyl boron, trimethoxy borane, triethoxy borane and diborane. At the same time $SiO_2$ and OSG films are not water soluble, but will allow for the diffusion of wather through then thus allowing for the dissolution of the for example $GeO_2$ covered by a porous silicate or porous OSG layer.

The present invention further proposes to use a porous silicate coating over a water soluble metal oxide layer to allow for the water to diffuse through the porous layer and etch the underlying water soluble metal oxide layer without having to etch the structure to expose the edge of the underlying layer.

Examples for possible uses for this technology are: formation of air gaps in semiconductor manufacturing, formation of tunnels for the delivery of gases or liquids for example for use in drug delivery, or for the formation of a hollow core in the fabrication of advanced fiber optic cables.

Figure 5:
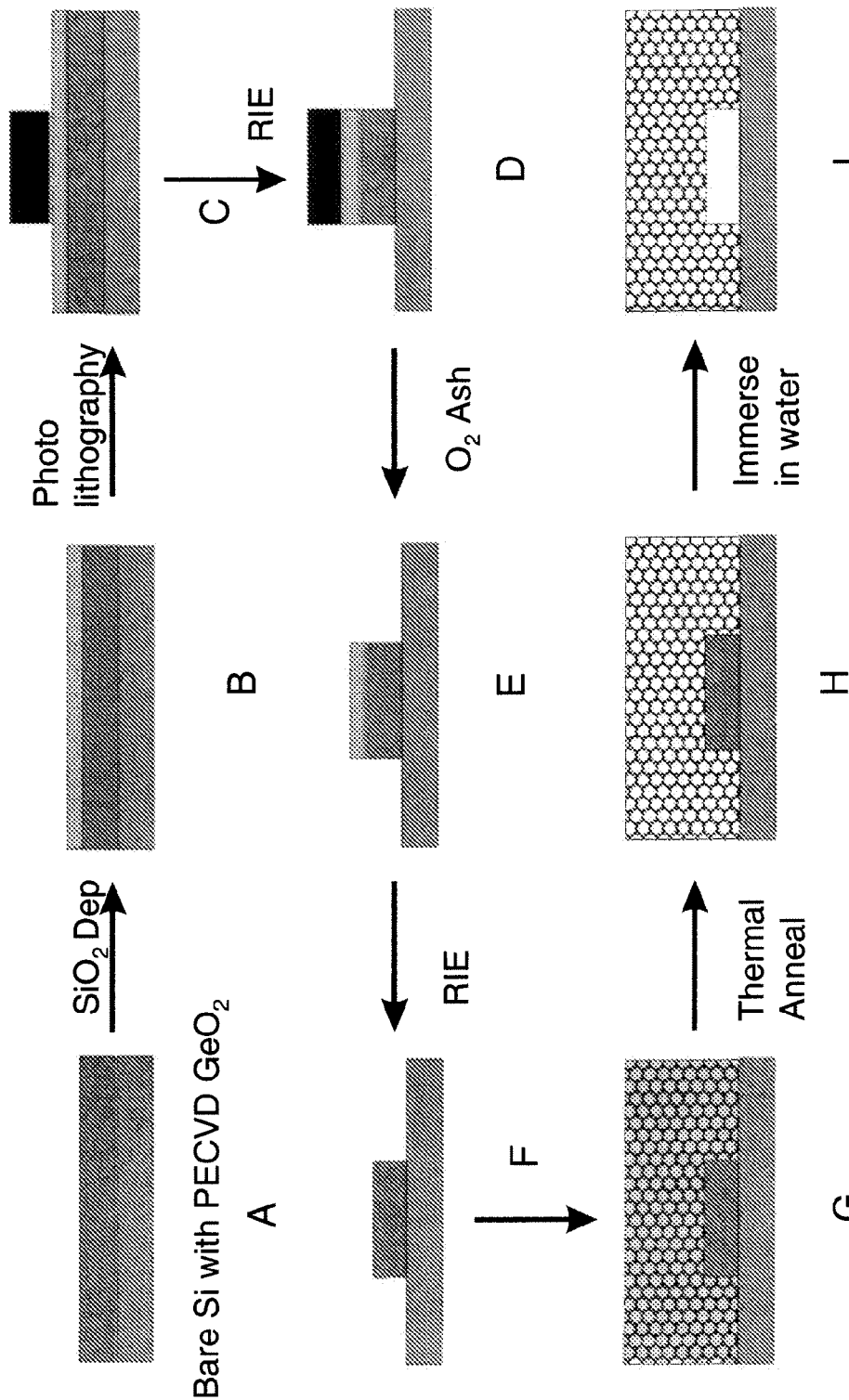
FIG. 5 Shows a cross section view illustrating progressive steps of a further alternate method and embodiment of the present invention using a polar solvent, such as water, to remove $GeO_2$ sacrificial material in the void space.

FIG. 5A-I shows on exemplary pathway for the formation of void spaces. In this process a silicon wafer is coated with a layer of a water soluble metal oxide, for example $GeO_2$ (FIG. 5A). Onto this water soluble metal oxide layer a barrier layer such as layer of $SiO_2$ can be deposited using for example a PECVD process (FIG. 4B), the barrier layer is used in this case to prevent dissolution of the water soluble metal oxide by aqueous tetramethylammonium hydroxide during photolithography to develop the resist pattern (FIG. 5C), this layer may not be necessary if other pattern transfer techniques are used such as ink-jet or imprint lithography are employed. FIG. 5D depicts the structure after the water soluble metal oxide is etched, this can be by for example RIE or using any of a number of fluorocarbons including $CF_4$, $C_4F_6$, $C_4F_8$ etc. Next as shown in FIG. 5F the pattern transfer material (i.e. photoresist) is removed in an ashing step, a number of different processes can be used in the ashing step, ie a $O_2$ reactive ion etching step, a $O_2$ downstream ash, a reducing ash such as a $H_2$ or $NH_3$ downstream ash, or a UV assisted ash etc. These lines were then coated with a composite silica or OSG layer as shown in FIG. 5G. Any number of processes can be utilized to form this composite layer, for example: using a spin coater and Meso-ELK product (Air Products and Chemicals, Inc., Allentown, Pa.), as described in U.S. Pat. Nos. 6,365,266; 6,592,980; 6,818,289 and 6,942,918 or deposited via PECVD in a PDEMS process (Air Products and Chemicals, Inc., Allentown, Pa.), as described in U.S. Pat. Nos. 6,583,048 and 6,846,515. The porogen used to form the composite silica or porous OSG in then removed in an anneal step as shown in FIG. 4H, this anneals step can be any number of processes, for example thermal annealing under an inert atmosphere, thermal annealing under an oxidizing atmosphere, thermal annealing under vacuum, reactive ion etching such as $O_2$ plasma, UV annealing under atmospheric or reducted pressures etc. These samples were then exposed to $BrF_3$ at 10 Torr and room temperature for a period of time as shown in FIG. 5I.

Figure 9C:
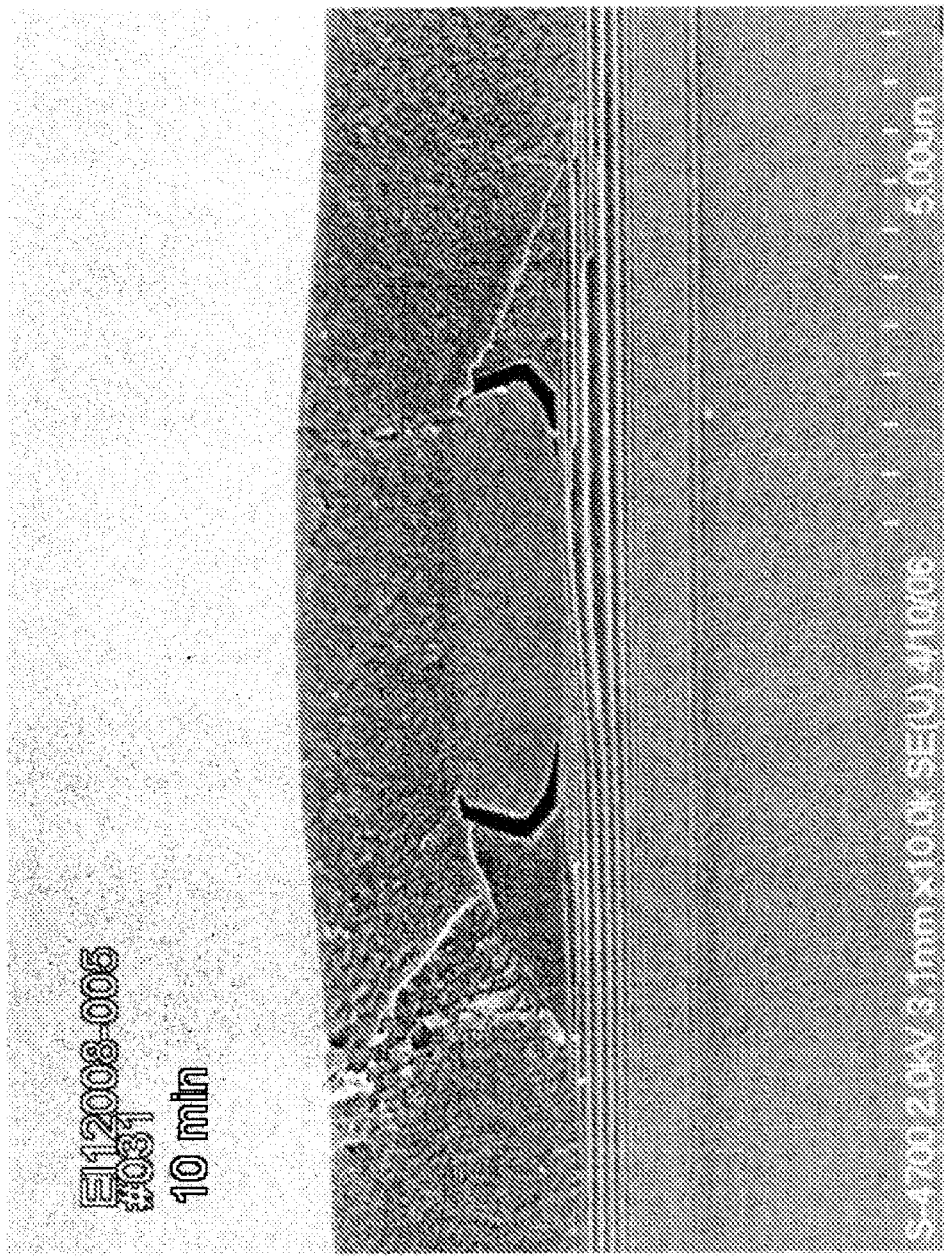

FIG. 9C shows the SEM photographs after dissolution of a portion of the GeO$_2$ with water to remove the sacrificial water soluble metal oxide leaving behind "tunnels" in the porous OSG network.

For use in air-gap fabrication the mode would be similar to that for using the pure porogen as the sacrificial layer, except in this case the GeO$_2$ would be used as the sacrificial layer, in fact it may be possible to fabricate the entire semiconductor device before the air gaps are fabricated, this may offer some advantages in mechanical integrity during packaging which is a major issue for materials with low mechanical integrity.

For use in liquid or gas channels it could be envisioned that the GeO$_2$ layer could be etched into a pattern allowing for mixing of chemicals at given points along the wafer, by allowing for multiple layers of channels it could be possible to do multiple step synthesis of molecules on a single chip. Once the desired structure of porous silica or OSG and GeO$_2$ layers were fabricated the device would be exposed to water in order to etch away the GeO$_2$ to leave open channels. It may be advantageous to fill up the pores in the porous silica or OSG layers if necessary to prevent diffusion of the gases or liquids though the porous layer from one channel to another. One way this might be done is to fill the pores with a polymizable organic species, such as a liquid which can be activated towards polymerization effectively filling the pores. This process is facilitated by the capillary effect which will render liquid inside the pores less volatile than material in the channels.

The fabrication of hollow core fiber optic cables is advantageous because of the large difference in refractive indexes (RI's) between air (RI=1) and a porous silica or OSG (RI=1.2-1.4), this difference will allow greater signal densities and decrease the signal loss compared to conventional solid core fiber optic cables. To fabricate a hollow core fiber optic cable one could envision first forming a thin strand of GeO$_2$ and then coating this with a porous silica or OSG layer. The silicon core could then be dissolved away using water. It may be advantageous to then further coat this hollow core fiber with another layer in order to provide mechanical strength.

B$_2$O$_3$ can be used in place of GeO$_2$ as a water soluble metal oxide. Various polar solvents can be used in place of water, such as: alcohols, ethers, heteroatom containing molecules, esters, ketones, aldehydes and mixtures of such solvents.

It may also be possible to co-deposit the GeO$_2$ and or B$_2$O$_3$ along with the SiO$_2$ and or OSG in order to form a porous layer by dissolution of an inorganic porogen, in this manner the device fabrication could be completed by dissolving the GeO$_2$ and or B$_2$O$_3$ in water.

DEPOSITION METHODS

As mentioned previously, the sacrificial material and composite layers are deposited onto at least a portion of a substrate from a precursor composition or mixture using a variety of different methods. These methods may be used by themselves or in combination. Some examples of processes that may be used to form the organosilicate film include the following: thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition (aka iCVD, or cat-CVD), photo initiated chemical vapor deposition, CVD of a liquid polymer precursor, deposition from supercritical fluids, or transport polymerization ("TP"). In certain preferred embodiments, the deposition is conducted at a temperature ranging from 100 to 425° C., preferably from 200 to 425°, and more preferably from 200 to 350°. Although the chemical reagents used herein may be sometimes described as "gaseous", it is understood that the chemical reagents may be delivered directly as a gas to the reactor, delivered as a vaporized liquid, a sublimed solid and/or transported by an inert carrier gas into the reactor.

In certain embodiments of the present invention, the sacrificial and composite materials are formed through a plasma-enhanced chemical vapor deposition process. Briefly in a PECVD process, chemical reagents are flowed into a reaction chamber such as a vacuum chamber and plasma energy energizes the chemical reagents thereby forming a film on at least a portion of the substrate. In these embodiments, the layers of the substrate can be formed by the co-deposition, or alternatively the sequential deposition, of a gaseous mixture comprising at least one plasma-polymerizable organic material to form the sacrificial layer and at least one silica-containing precursor such as an organosilane or organosiloxane to form the composite layer. In certain embodiments, the plasma energy applied to the reagents may range from 0.02 to 7 watts/cm$^2$, more preferably 0.3 to 3 watts/cm$^2$. Flow rates for each of the reagents may ranges from 10 to 5000 sccm. Pressure values in the vacuum chamber during deposition for a PECVD process of the present invention may range from 0.01 to 600 torr, more preferably 1 to 10 torr. It is understood however that process parameters such as plasma energy, flow rate, and pressure may vary depending upon numerous factors such as the surface area of the substrate, the equipment used in the PECVD process, etc.

In addition to the one or more chemical, additional materials can be charged into the vacuum chamber prior to, during and/or after the deposition reaction. Such materials include, e.g., inert gas (e.g., He, Ar, N$_2$, Kr, Xe, etc., which may be employed as a carrier gas for lesser volatile precursors and/or which can promote the curing of the as-deposited materials and provide a more stable final film) and reactive substances, such as gaseous or liquid organic substances, NH$_3$, H$_2$, CO$_2$, CO, O$_2$, or N$_2$O. CO$_2$ is the preferred carrier gas.

Energy is applied to the gaseous reagents to induce the gases to react and to form the film on the substrate. Such energy can be provided by, e.g., thermal, hot filament, plasma, pulsed plasma, helicon plasma, high-density plasma, inductively coupled plasma, and remote plasma methods. A secondary RF frequency source can be used to modify the plasma characteristics at the substrate surface. Preferably, the film is formed by plasma enhanced chemical vapor deposition. It is particularly preferred to generate capacitively coupled plasma at a frequency of 13.56 MHz. Plasma power is preferably from 0.02 to 7 watts/cm$^2$, more preferably 0.3 to 3 watts/cm$^2$, based upon a surface area of the substrate. It may be advantageous to employ a carrier gas, which possesses low ionization energy to lower the electron temperature in the plasma, which in turn will cause less fragmentation in the OSG precursor(s). Examples of this type of low ionization gas include CO$_2$, NH$_3$, CO, CH$_4$, Ar, Xe, and Kr.

The flow rate for each of the gaseous reagents preferably ranges from 10 to 5000 sccm, more preferably from 30 to 1000 sccm, per single 200 mm wafer. The individual rates are selected so as to provide the desired amounts of structure-former and pore-former in the film. The actual flow rates needed may depend upon wafer size and chamber configuration, and are in no way limited to 200 mm wafers or single wafer chambers. In certain embodiments, the film may be deposited at a deposition rate of at least 50 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

As well as the vapor deposition methods outlined above it is possible in certain embodiments to apply the composite films using spin-on technologies, for example Air Products and Chemicals Meso-ELK™ films, for examples films deposited in accord with U.S. Pat. No. 7,122,880.

These films are generally formed by employing a spin-on technique using a mixture. The mixture generally comprises an at least one silica source and at least one porogen. The mixture may further include other constituents such as, but not limited to, water, solvent(s), catalyst, and/or ionic additives.

As mentioned previously, the mixture comprises at least one silica source. A "silica source", as used herein, is a compound having silicon (Si) and oxygen (O) and possibly additional substituents such as, but not limited to, other elements such as H, B, C, P, or halide atoms and organic groups such as alkyl groups; or aryl groups. The term "alkyl" as used herein includes linear, branched, or cyclic alkyl groups, containing from 1 to 24 carbon atoms, preferably from 1 to 12 carbon atoms, and more preferably from 1 to 5 carbon atoms. This term applies also to alkyl moieties contained in other groups such as haloalkyl, alkaryl, or aralkyl. The term "alkyl" further applies to alkyl moieties that are substituted, for example with carbonyl functionality. The term "aryl" as used herein six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—H bonds, Si—F bonds, or C—H bonds. It is preferred that the at least one silica source imparts a minimum of Si—OH bonds in the dielectric material.

The mixture used to form the films of the present invention further comprises a porogen. A "porogen", as used herein, is a reagent that is used to generate void volume within the resultant film. Suitable porogens for use in the composite materials of the present invention include labile organic groups, solvents, decomposable polymers, surfactants, dendrimers, hyper-branched polymers, polyoxyalkylene compounds, organic macromolecules, or combinations thereof. Still further examples of suitable porogens include those porogens described in pending patent application, which is assigned to the assignee of the present invention.

In certain embodiments of the present invention, the porogen may include labile organic groups. When some labile organic groups are present in the reaction mixture, the labile organic groups may contain sufficient oxygen to convert to gaseous products during the cure step. Some examples of compounds containing labile organic groups include the compounds disclosed in U.S. Pat. No. 6,171,945, which is incorporated herein by reference in its entirety.

In some embodiments of the present invention, the porogen may be a solvent. In this connection, the solvent is generally present during at least a portion of the cross-linking of the matrix material. Solvents typically used to aid in pore formation have relatively higher boiling points, i.e., greater than 175° C., preferably greater than 200° C. Solvents suitable for use as a porogen within the mixture of the present invention include those solvents provided, for example, in U.S. Pat. No. 6,231,989.

In certain embodiments, the porogen may be a small molecule such as those described in the reference Zheng, et al., "Synthesis of Mesoporous Silica Materials with Hydroxyacetic Acid Derivatives as Templates via a Sol-Gel Process", J. Inorg. Organomet. Polymers, 10, 103-113 (2000).

The porogen could also be a decomposable polymer. The decomposable polymer may be radiation decomposable, or more preferably, thermally decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Thermally decomposable polymers undergo thermal decomposition at temperatures that approach the condensation temperature of the silica source materials and are present during at least a portion of the cross-linking. Such polymers are those which foster templating of the vitrification reaction, control and define pore size, and decompose and diffuses out of the matrix at the appropriate time in processing. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The porogen may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71–132 (1996) that is incorporated herein by reference in its entirety.

The porogen within the film-forming mixture may also be a polyoxyalkylene compound such as polyoxyalkylene nonionic surfactants, polyoxyalkylene polymers, polyoxyalkylene copolymers, polyoxyalkylene oligomers, or combinations thereof. An example of such is a polyalkylene oxide that includes an alkyl moiety ranging from $C_2$ to $C_6$ such as polyethylene oxide, polypropylene oxide, and copolymers thereof.

The porogen of the present invention could also comprise a surfactant. For silica sol-gel based films in which the porosity is introduced by the addition of surfactant that is subsequently removed, varying the amount of surfactant can vary porosity. Typical surfactants exhibit an amphiphilic nature, meaning that they can be both hydrophilic and hydrophobic at the same time. Amphiphilic surfactants possess a hydrophilic head group or groups, which have a strong affinity for water and a long hydrophobic tail that is organophilic and repels water. The surfactants can be anionic, cationic, nonionic, or amphoteric. Further classifications of surfactants include silicone surfactants, poly (alkylene oxide) surfactants, and fluorochemical surfactants.

In embodiments where the film is formed through a spin-on approach, the mixture comprises, inter alia, at least one silica source, a porogen, a catalyst, an ionic additive, and water. In certain preferred embodiments, the mixture further comprises a solvent and a surfactant. In brief, dispensing the mixture onto a substrate and evaporating the solvent and water can form the films. The surfactant and remaining solvent and water are generally removed by curing the coated substrate to one or more temperatures and for a time sufficient to produce the composite film.

The coated substrate is then further heated or cured to form the porous $SiO_2$ or OSG film. Specific temperature and time durations will vary depending upon the ingredients within the mixture, the substrate, and the desired pore volume. In certain embodiments, the cure step is conducted at two or more temperatures rather than a controlled ramp or soak. The first temperature, typically below 300° C., may be to remove the water and/or solvent from the mixture and to further cross-linking reactions. The second temperature may be to remove the porogen and to substantially, but not necessarily completely, cross-link the material.

Removal of Organic Porogens and Sacrificial Materials

The organic porogen and sacrificial materials are removed by a curing step, which can comprise thermal annealing, chemical treatment, in-situ or remote plasma treating, electron beam treatment, photocuring and/or microwaving. Other in-situ or post-deposition treatments may be used to enhance the materials properties of the remaining porous $SiO_2$ or porous OSG such as hardness, stability (to shrinkage, to air exposure, to etching, to wet etching, etc.), integrability, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogen, stabilize the film and/or to enhance material properties.

The conditions under which post-treating are conducted can vary greatly. For example, post-treating can be conducted under high pressure or under a vacuum ambient.

Annealing is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr. However, a vacuum ambient is also possible for thermal annealing as well as any other post-treating means. The temperature is preferably 200-500° C., and the temperature ramp rate is from 0.1 to 100 deg ° C./min. The total annealing time is preferably from 0.01 min to 12 hours.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

Removal of the porogen and sacrificial organic material via UV exposure is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total curing time is preferably 0.01 min to 12 hours.

Removal of the porogen and sacrificial organic material via microwave exposure is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Removal of the porogen and sacrificial organic material via electron beam exposure is conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

Films of the invention may also contain fluorine, in the form of inorganic fluorine (e.g., Si—F). Fluorine, when present, is preferably contained in an amount ranging from 0.5 to 7 atomic %.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive materials for use as sacrificial materials in an air gap structure, the present invention includes the process by which the products are made, methods of using the products and compounds and compositions useful for preparing the products.

Figure 6:
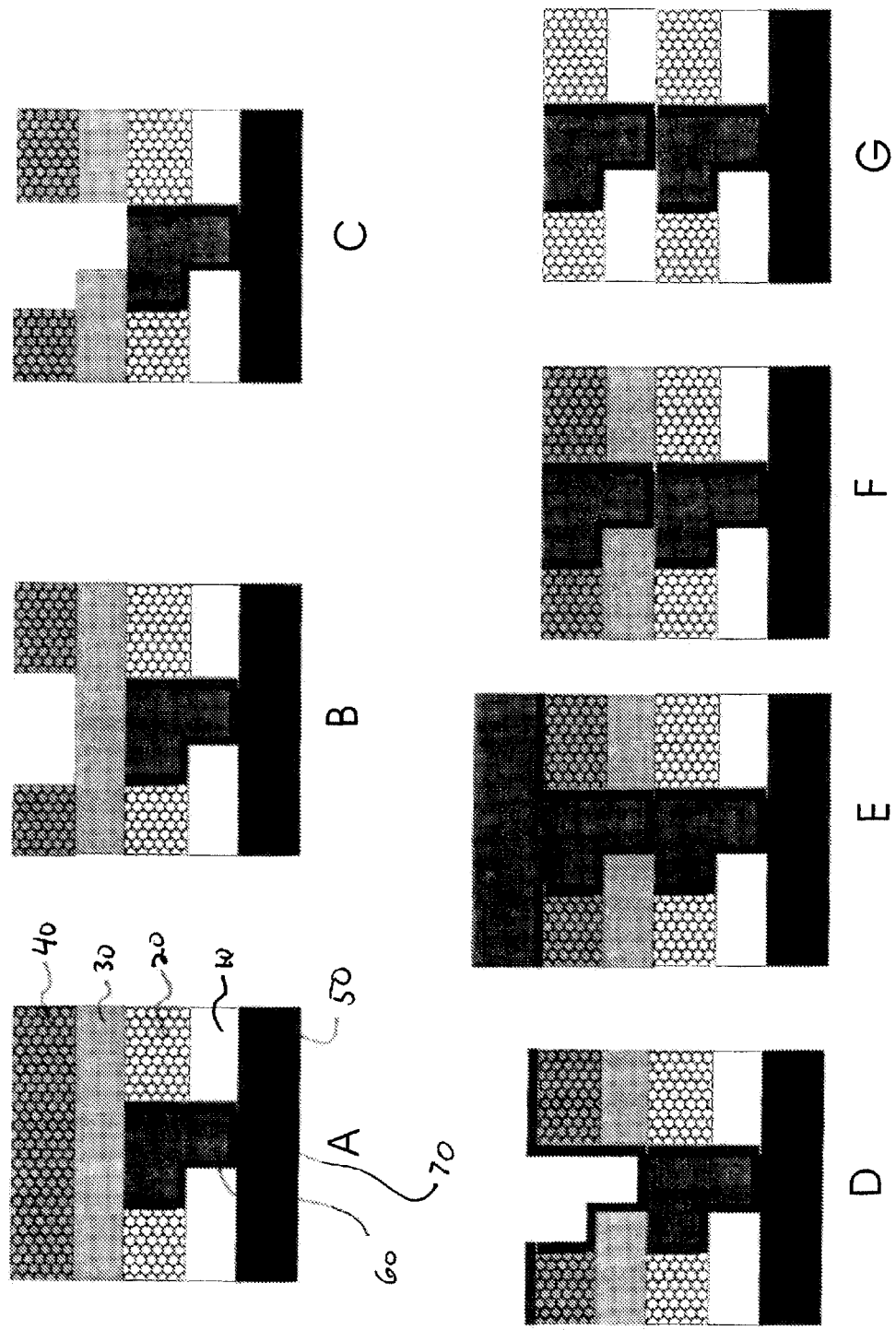
FIG. 6 Shows one possible route to forming a dual damascene copper metal interconnect scheme.

FIGS. 6A-G show a cross sectional view illustrating the steps of a method for forming a semiconductor substrate of the present invention. FIG. 6A shows a layer (40) of porogen plus $SiO_2$ or OSG on top of a layer of sacrificial materials (30). Underneath these layers is an already fabricated air gap interconnect level comprising at least a void space (10), a porous silica or OSG layer (20), a metallization layer (60), and copper metal (70) on top of a substrate (50). In FIG. 6B the top layer (40) consisting of at least porogen and silica or OSG is etched preferable using photolithographic techniques. After the top layer (40) is patterned the via level can be etched into the sacrificial layer (30) using standard photolithographic techniques as shown in FIG. 6C. A copper barrier layer (60), comprising at least one of Ta, TaN, Ru, Ti, TiN, TiSiN, is then deposited as shown in FIG. 6D. Copper (70) is then deposited by for example electroplating or electroless plating FIG. 6E, followed by CMP of the copper and barrier to form a planar structure FIG. 6F. Finally the porogen and sacrificial layers are removed as shown in FIG. 6G.

Figure 7:
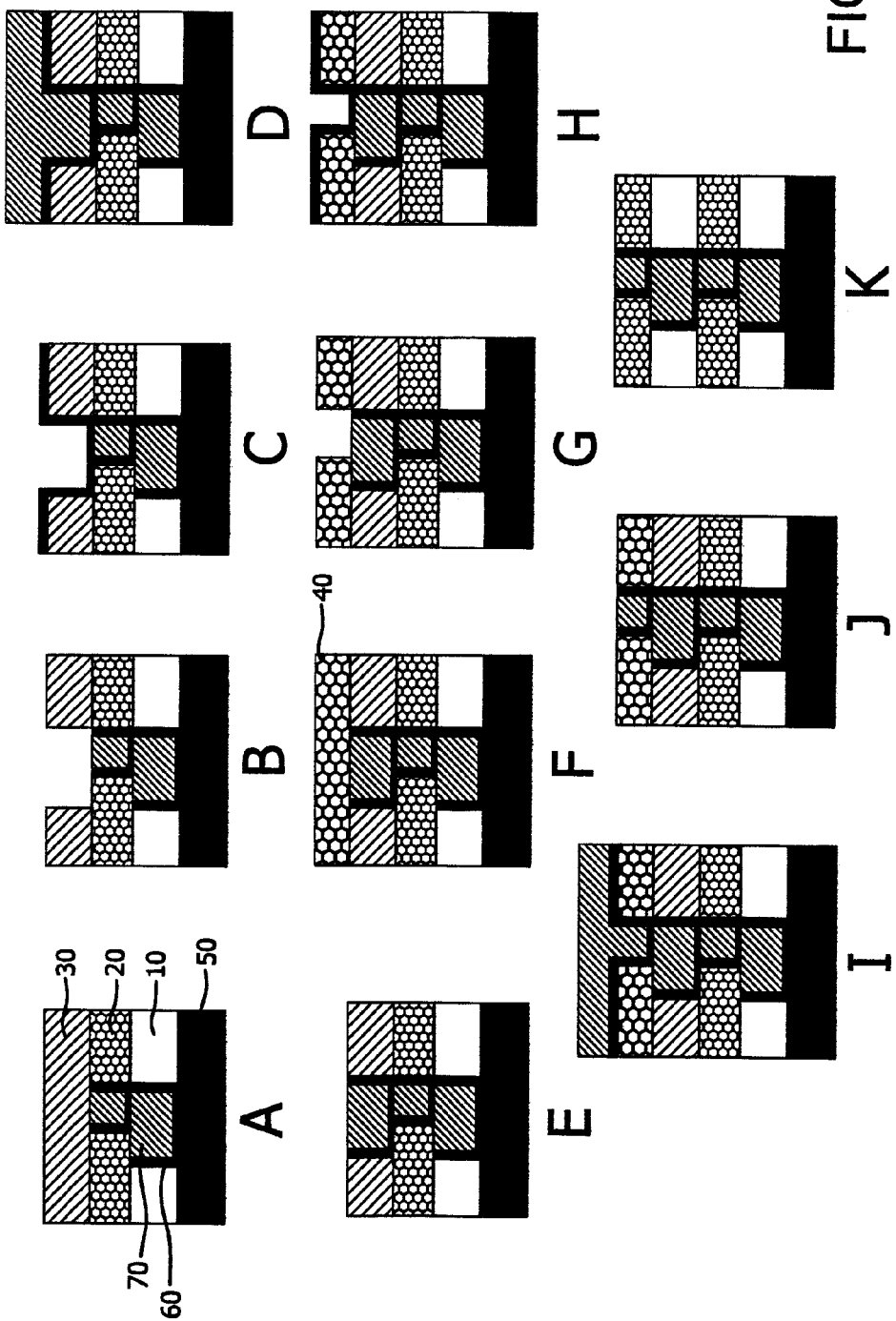
FIG. 7 Shows one possible route to forming a single damascene copper metal interconnect scheme.

The single damascene method shown in FIGS. 7A-7K which allows the sacrificial layer to be formed between the metal lines. In this method each layer is deposited and etched separately. First the sacrificial layer (30) is deposited and etched in FIGS. 7A and 7B. A copper barrier layer (60), comprising at least one of Ta, TaN, Ru, Ti, TiN, TiSiN, is then deposited as shown in FIG. 7C. Copper (70) is then deposited by for example electroplating or electroless plating FIG. 7D, followed by CMP of the copper and barrier to form a planar structure FIG. 7E. The composite silica or SOG layer with porogen (40) is then deposited (FIG. 7F) and etched (FIG. 7G). A copper barrier layer (60), comprising at least one of Ta, TaN, Ru, Ti, TiN, TiSiN, is then deposited as shown in FIG. 7H. Copper (70) is then deposited by for example electroplating or electroless plating FIG. 7I, followed by CMP of the copper and barrier to form a planar structure FIG. 7J. Finally the porogen and sacrifial materials can be removed as shown in FIG. 7K.

Figure 8:
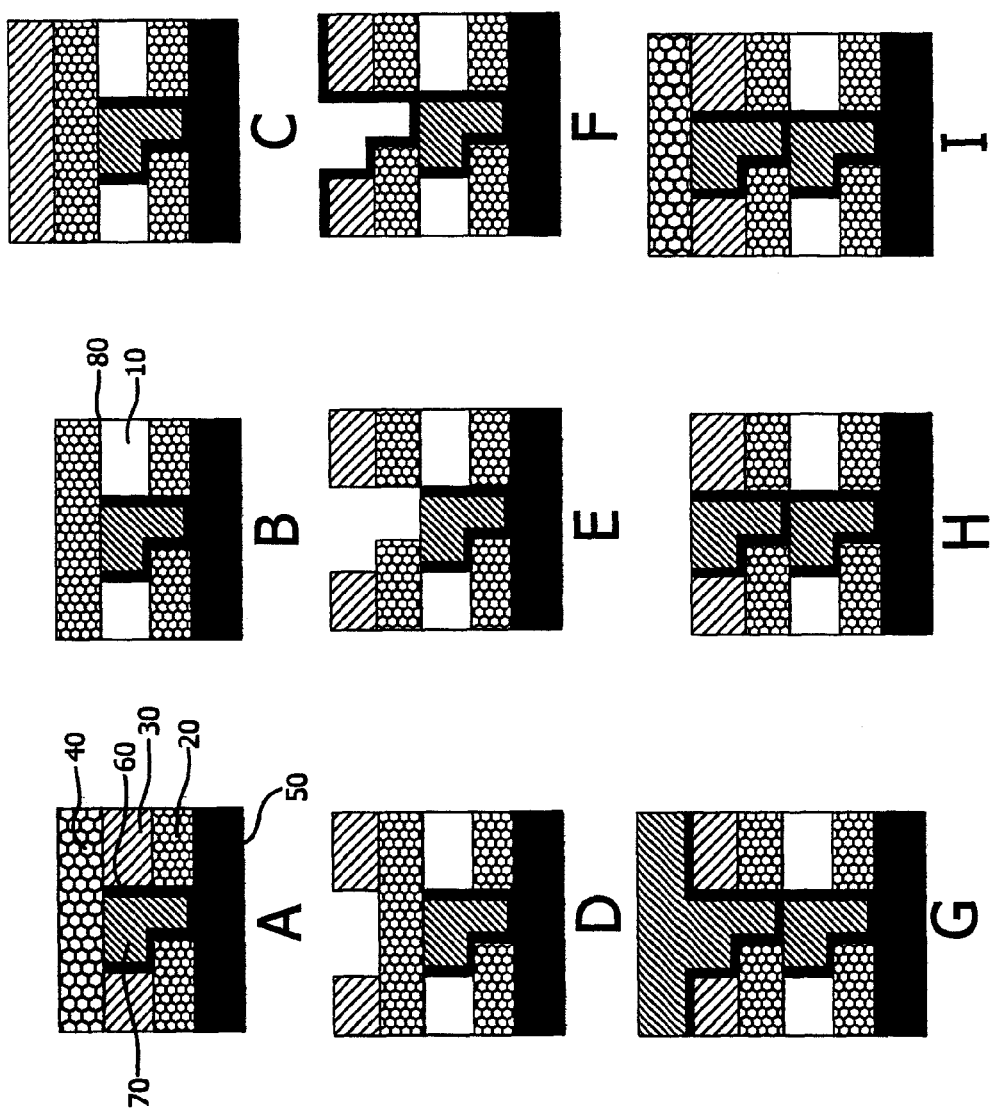
FIG. 8 Shows another possible route to forming a dual damascene copper metal interconnect scheme.

FIGS. 8A-I show schematically how air gaps might be formed between metal lines using a Dual Damascene approach. Initially a composite silica or OSG layer with porogen (40) is deposited onto a substrate 50 as shown in FIG. 8A. The porogen is then removed to yield a porous silica or OSG layer (20) as shown in FIG. 8B. A sacrificial layer (30) is then deposited over the porous layer (20) as shown in FIG. 8C. The sacrificial layer and the porous layers are then etched using photolithographic techniques (FIG. 8D-E), it may be necessary to use a hard mask at this step in order to enhance the etch and ash selectivity's between the sacrificial layer and the photoresist, especially if the sacrificial layer is an organic materials. A copper barrier layer (60), comprising at least one of Ta, TaN, Ru, Ti, TiN, TiSiN, is then deposited as shown in FIG. 8F. Copper (70) is then deposited by for example electroplating or electroless plating FIG. 8G, followed by CMP of the copper and barrier to form a planar structure FIG. 8H. A composite layer of silica or OSG with porogen (40) is then deposited on top FIG. 8I.

The preceding descriptions are intended to be exemplary and additional steps and or layers may be needed in order to complete the integration schemes described. It may also be advantageous in certain embodiments to include layers, such as: an etch stop layer, an anti-reflective coating, a $SiO_2$ hardmask layer, a TiN or other metal hardmask, liners, barrier layers, Cu diffusion layers, metal seed layers, metal adhesion layers, carbon hardmasks etc to assist in the delineation and fabrication of the structure. Further examples would include but not be limited to: hard mask layer, etch stop barrier layers, adhesion layers, adhesion promoters, stress buffers, etch post treatment, restoration chemistries, sacrificial layers for trechfirst of via-first dual damascene etch etc.

The invention will be illustrated in more detail with reference to the following Examples, but it should be understood that the present invention is not deemed to be limited thereto.

EXAMPLES

Exemplary films were formed via a plasma enhanced CVD process using an Applied Materials Precision-5000 system in a 200 mm DxZ vacuum chamber that was fitted with an Advance Energy 200 rf generator from a variety of different chemical precursors and process conditions. The CVD process generally involved the following basic steps: initial set-up and stabilization of gas flows, deposition, and purge/evacuation of chamber prior to wafer removal. The thickness and refractive index of each film were measured on an SCl Filmtek 2000 Reflectometer. RIE etching was performed on an AMAT platform using standard RIE etch recipes. Photolithography was performed using a KarlSuss MA6 contact stepper at 365 nm and developed using standard TMAH developer solutions. After RIE etching of the features the remaining photoresist was removed in an $O_2$ downstream ashing tool.

Where applicable, thermal post-deposition treatment or annealing was performed in an Applied Test Systems, Inc. Series 3210 tube furnace fitted with 4" diameter purged quartz tube with a nitrogen flow ranging from 2 to 4 slpm. The ramp rate was 13° C. per minute from 25 to 425° C. At 425° C., the films were soaked for 4 hours. The films were allowed to cool to below 100° C. before removal from the furnace.

Examples 1 Through 3

Deposition of Sacrificial Layers Using Organic Precursors

Three exemplary sacrificial layers were deposited upon the surface of a substrate via a plasma-enhanced CVD process as described herein. Table I provides deposition conditions for the three exemplary sacrificial layers.

TABLE I

Deposition Parameters of Various Organic Precursors

| Deposition Parameters | Ex. 1: Decahydro-naphthalene (DHN) | Ex. 2: 1,5-dimethyl-1,5-cyclooctadiene (DM-COD) | Ex. 3: Alpha-terpinene (ATP) | Ex. 4: Limonene (Limo) |
|---|---|---|---|---|
| Liquid Flow (m/gm) | 600 | 600 | 600 | 800 |
| Carrier Gas Flow | 500 sccm ($CO_2$) | 500 sccm ($CO_2$) | 220 sccm ($CO_2$) | 200 sccm ($CO_2$) |
| Deposition Temp. | 200° C. | 200° C. | 250° C. | 250° C. |
| Chamber Press. | 10 Torr | 8 Torr | 8 Torr | 8 Torr |
| Spacing (milli-inch) | 400 | 400 | 350 | 350 |
| Plasma Power | 600 W | 600 W | 600 W | 600 W |
| Deposition Rate | 87 nm/min | 126 nm/min | 87 nm/min | 45 nm/min |

Example 4

Deposition of an Limo Sacrificial Layer with a DEMS/Limo Composite Layer

A sacrificial layer was deposited using the following recipe: 800 mg/min Limo liquid flow, 200 sccm $CO_2$ carrier gas flow, 350 milli-inch showerhead/wafer spacing, 250° C. wafer chuck temperature, 8 Torr chamber pressure for 360 seconds to yield a film with the following properties: 289 nm film thickness and a refractive index of 1.568.

A composite layer was deposited atop the Limo sacrificial layer using the following recipe: 800 mg/min liquid flow (20/80 DEMS/Limo molar mixture), 220 sccm $CO_2$ carrier gas flow, 350 milli-inch showerhead/wafer spacing 250° C. wafer chuck temperature, 8 Torr chamber pressure for 60 seconds to yield a film with the following properties: 114 nm film thickness and a refractive index of 1.439.

This wafer was then coated with 500 nm of Shipley 1805 resist and developed using a KarlSuss MA6 contact stepper at 365 nm, 12 mW/cm$^2$ for 1 second exposure. The pattern was then developed using TMAH.

This patterned wafer was then etched using the following sequence: first a 6 second high density $O_2$ plasma to clear the pattern, followed by a 60 second etch using a $C_4F_8/O_2$/Ar etch recipe which has an etch rate of 140 nm/minute to clear the hard mask, followed by a second $O_2$ plasma for 24 seconds to etch away the photoresist on top of the hard mask as well as etching the sacrificial limonene layer. A capping composite layer was then deposited using the following recipe: 800 mg/min liquid flow (20/80 DEMS/Limo molar mixture), 220 sccm $CO_2$ carrier gas flow, 350 milli-inch showerhead/wafer spacing 250° C. wafer chuck temperature, 8 Torr chamber pressure for 180 seconds to yield a film with the following properties: 362 nm film thickness and a refractive index of 1.439.

This structure was then thermal annealed to remove the porogen and the sacrificial layer to form the air-gap. Scanning electron microscope (SEM) pictures of this stack and after thermal annealing is shown in FIG. 9A.

Example 5

The fabrication of an air gap using selective etching of a silicon feature began by thermally oxidizing a bare silicon wafer to provide an etch stop for the $XeF_2/BrF_3$ selective etching. On top of the thermal oxide a 0.5 micron thick layer of poly-silicon was grown via high temperature (900° C.) CVD process using silane, other type of silicon such as amorphous silicon could also be used. The poly-silicon was patterned using standard photolithography techniques and a $BCl_3$ based RIE process. After etching the poly-silicon the photoresist was ashed in a $O_2$ plasma and the patterned poly-silicon feature were then coated with a composite OSG layer using Air Products' proprietary Meso-ELK™ spin-on porous OSG process. The stack was then calcined at 400 C. in air to remove the porogen. The sample was exposed to 10 Torr of $BrF_3$ at room temperature for 1 hour. The $BrF_3$ diffused through the Meso-ELK structure and selectively etched the silicon feature. SEM pictures of the air gap formed after selective etching of the silicon layer using $BrF_3$ are shown in FIG. 9B. $XeF_2$ can also be used for this fabrication process.

Example 6

Fabrication of an air gap using a water soluble sacrificial layer started with the deposition of a 1.2 micron layer of $GeO_2$ onto a silicon wafer. We used PECVD to deposit the $GeO_2$ from $Me_4Ge$ and $O_2$, although other germanium based precursors, such as $Ge(OEt)_4$, could also have been used. A layer of $SiO_2$ was deposited on top of the $GeO_2$ using $Me_4Si$ plus $O_2$ to act as a moisture barrier during TMAH developing of the photoresist, again many different $SiO_2$ or OSG precursors could be used for the moisture barrier. Once the photoresist was patterned and developed the $SiO_2/GeO_2$ stack was etched in a $CF_4/Ar/O_2$ RIE process. After removal of the photoresist in a $O_2$ plasma ash process the $SiO_2$ cap can remain or be removed in a timed $CF_4/Ar/O_2$ RIE process, in this example the cap was removed in a timed etch. The Patterned $GeO_2$ was then coated with a composite OSG layer using Air Products' proprietary Meso-ELK™ spin-on porous OSG process. The composite layer was calcined at 400° C. in air to remove the porogen. After coating with the porous OSG the film was dipped in water for 10 minutes during which time the $GeO_2$ dissolved away. A SEM crossection of the partially dissolved $GeO_2$ sacrificial layer under a porous OSG layer is shown in FIG. 9C. This process could also have been carried out using $B_2O_3$ or other water soluble metal oxide materials as the sacrificial material using a similar scheme The technology of the present invention was successful in fabricating air gap structures using three different sacrificial materials. The first material was a labile organic sacrificial material, which was the same labile material used to create pores in the Porous OSG layer, this unity allows for the creation of the structure. By using the same material as both the sacrificial material and the porogen, the same PECVD chamber could be used for both layers, and one annealing step could be used to both create the air gap and create the porous OSG through which the by-products from the air gap creation diffuses. Another advantage with this process was that the PECVD deposition processes could be carrier out at temperatures >250° C., which allows for a more dimensionally stable sacrificial material relative to a spin-on polymer.

The second sacrificial material was a water soluble $GeO_2$ structure. Using an inorganic material as the sacrificial material gave the structure more mechanical strength and allowed for the use of more standard etch processes in the fabrication of the structure. One difficulty with $GeO_2$ or $B_2O_3$ in the fabrication of air gaps was the sensitivity to wet processes such as: developers, strippers, Cu deposition and CMP. If the $GeO_2/B_2O_3$ structure can be protected from these processes by hard masks or Cu barriers, then $GeO_2/B_2O_3$ offers unique advantages, due to thermal robustness and mechanical strength.

The final successful sacrificial material was silicon. Silicon could be used because of the selective nature of the $XeF_2$ or $BrF_3$ thermal etching for silicon versus $SiO_2$ or OSG, and the ability to deposit any of a number of porous OSG layers, for example using PDEMS™ or Meso-ELK porous dielectrics. Again, using an inorganic sacrificial layer gave the structure more mechanical strength during fabrication and allowed for more standard anisotropic etch processes.

While the invention has been described in detail and with reference to specific examples thereof, it will be apparent to one skilled in the art that various changes and modifications can be made therein without departing from the spirit and scope thereof.

We claim:
1. A process for forming an air gap, the process comprising:
   (a) providing a substrate;
   (b) depositing a sacrificial layer comprising silicon;
   (c) depositing a composite layer with a porogen and at least one silica-containing precursor or organosilicate glass (OSG) precursor;
   (d) applying energy to the substrate having the sacrificial layer and the composite layer to remove the porogen to form a porous layer; and
   (e) contacting the substrate having the sacrificial layer and the porous layer with a fluorine containing reagent under reduced pressure capable of diffusing through the porous layer to selectively remove the sacrificial layer to form air gaps;

wherein depositing step (b) is via a process selected from the group consisting of a chemical vapor deposition (CVD) and a plasma enhanced chemical vapor deposition (PECVD); and depositing step (c) is via a process selected from the group consisting of chemical vapor deposition (CVD), spin-on coating, dip coating and mist deposition.

2. The process for forming an air gap in claim 1, wherein the fluorine containing reagent is $XeF_2$ or $BrF_3$.

3. The process for forming an air gap in claim 1, wherein the fluorine containing reagent is a gas selected from the group consisting of HF, noble gas halides, inter-halogens, $ClF_3$ and mixtures thereof.

4. The process for forming an air gap in claim 1, wherein the energy in the applying step (d) includes at least one selected from the group consisting of α-particles, β-particles, γ-rays, x-rays, high energy electron, electron beam, visible light, infrared light, microwave frequency, radio-frequency, plasma, and combinations thereof.

5. The process for forming an air gap in claim 1, wherein the applying energy step (d) is performed under conditions selected from the group consisting of (1) an ultraviolet light having a power in the range of 0 to 5000 W;

an atmospheric condition selected from the group consisting of inert, oxidizing and reducing;

a temperature in the range of ambient to 500° C.; and an exposure time in the range of 0.01 minute to 12 hours; and (2) a thermal energy;

a pressure in the range of 10 mtorr to the atmospheric pressure;

an atmospheric condition selected from the group consisting of inert, oxidizing and reducing;

a temperature in the range of ambient to 500° C.;

and an exposure time in the range of 0.01 minute to 12 hours.

6. The process for forming an air gap in claim 1, further comprising of filling pores in the porous layer with a polymizable organic species which can be activated towards polymerization.

7. The process for forming an air gap in claim 1, wherein the step (e) is performed when temperature is less than 150° C.

8. The process for forming an air gap in claim 1 further comprising forming an etch stop layer to protect the base layer of the substrate.

9. The process for forming an air gap in claim 8, wherein the etch stop layer is a $SiO_2$ layer formed via thermally oxidizing a silicon substrate.

10. The process for forming an air gap in claim 1, further comprising of patterning a layer selected from the group consisting of the sacrificial layer, the composite layer, the porous layer and combinations thereof.

11. The process for forming an air gap in claim 1 further comprising repeating steps (a)-(e) at least one time for making multilevel structures.

12. The process for forming an air gap in claim 11, further comprising of filling pores in the porous layer.

13. The process for forming an air gap in claim 12, the filling process is performed by filling the pores with a polymizable organic species which can be activated towards polymerization.

* * * * *